US 6,556,168 B1

(12) United States Patent
Marumoto et al.

(10) Patent No.: US 6,556,168 B1
(45) Date of Patent: Apr. 29, 2003

(54) PHASED ARRAY ANTENNA AND ITS MANUFACTURING METHOD

(75) Inventors: Tsunehisa Marumoto, Tokyo (JP); Ryuichi Iwata, Tokyo (JP); Youichi Ara, Tokyo (JP); Hideki Kusamitu, Tokyo (JP); Kenichiro Suzuki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/869,203

(22) PCT Filed: Nov. 22, 1999

(86) PCT No.: PCT/JP99/06515

§ 371 (c)(1),
(2), (4) Date: Sep. 26, 2001

(87) PCT Pub. No.: WO00/39892

PCT Pub. Date: Jul. 6, 2000

(30) Foreign Application Priority Data

Dec. 24, 1998 (JP) ............................................. 10-368151

(51) Int. Cl.[7] ................................................ H01Q 3/22
(52) U.S. Cl. ..................................................... 342/372
(58) Field of Search ................................. 342/372, 373, 342/368; 343/700 MS

(56) References Cited

U.S. PATENT DOCUMENTS

| 3,484,785 | A | * | 12/1969 | Sheldon et al. ............. 342/372 |
| 4,994,814 | A | * | 2/1991 | Aoki et al. .................. 342/372 |
| 5,923,289 | A | * | 7/1999 | Buer et al. .................. 342/373 |
| 6,184,832 | B1 | * | 2/2001 | Geyh et al. .......... 343/700 MS |

FOREIGN PATENT DOCUMENTS

| CA | 2 241 375 A | 12/1998 |
| JP | 1-290301 | 11/1989 |
| JP | 3-182103 | 8/1991 |
| JP | 5-206718 | 8/1993 |
| JP | 5-74008 | 10/1993 |
| JP | 5-91016 | 12/1993 |
| JP | 5-91016 U | 12/1993 |
| JP | 6-267926 | 9/1994 |
| JP | 11/74717 | 3/1999 |

OTHER PUBLICATIONS

Gregorwich, W. "A Low Cost Lightweight Subarray for Multibeam Phased Arrays", 1998 IEEE Aerospace Conf. 3/98, pp243–24.*
Sturzebecher, D. et al, "20 GHz LTCC Phased Array Module", 1996 IEEE MTT–S Digest, 6/96, pp. 991–994.*
Das, Nirod, et al. "Multiport Scattering Analysis of General Multilayered Printed Antennas Fed by Multiple Feed Ports: Part II Applications". IEEE Trans.on Antennas and Propagation, vol. 40, No1 5, 5/92, pp. 482–491.*
Litva, John et al, "Design Study of an Integrated Array Architecture", Antennas and Propagation Society International Symposium, 1990, pp. 1154–1157.*

* cited by examiner

Primary Examiner—Gregory C. Issing
(74) Attorney, Agent, or Firm—Young & Thompson

(57) ABSTRACT

A relatively small phased array antenna is formed at a low cost even if the number of radiating elements increases in order to improve the gain. The phased array antenna has a multilayered structure in which a number of radiating elements (15), a phase shift unit (16) for changing the phase of an RF signal transmitted/received at each radiating element, and a distribution/synthesis unit (14) are formed on different layers. Signal lines (X1–Xm) and scanning lines (Y1–Yn) are wired on a phase control layer (35) to connect phase shift units to each other in a matrix. The signal lines and the scanning lines are matrix-driven by selection units (12X, 12Y) so that desired phase shift amounts are set to phase shift units located at the intersections of the signal and scanning lines. In addition, circuit portions repeatedly arranged in a single phase shift unit are formed into single chips mounted on another substrate.

5 Claims, 17 Drawing Sheets

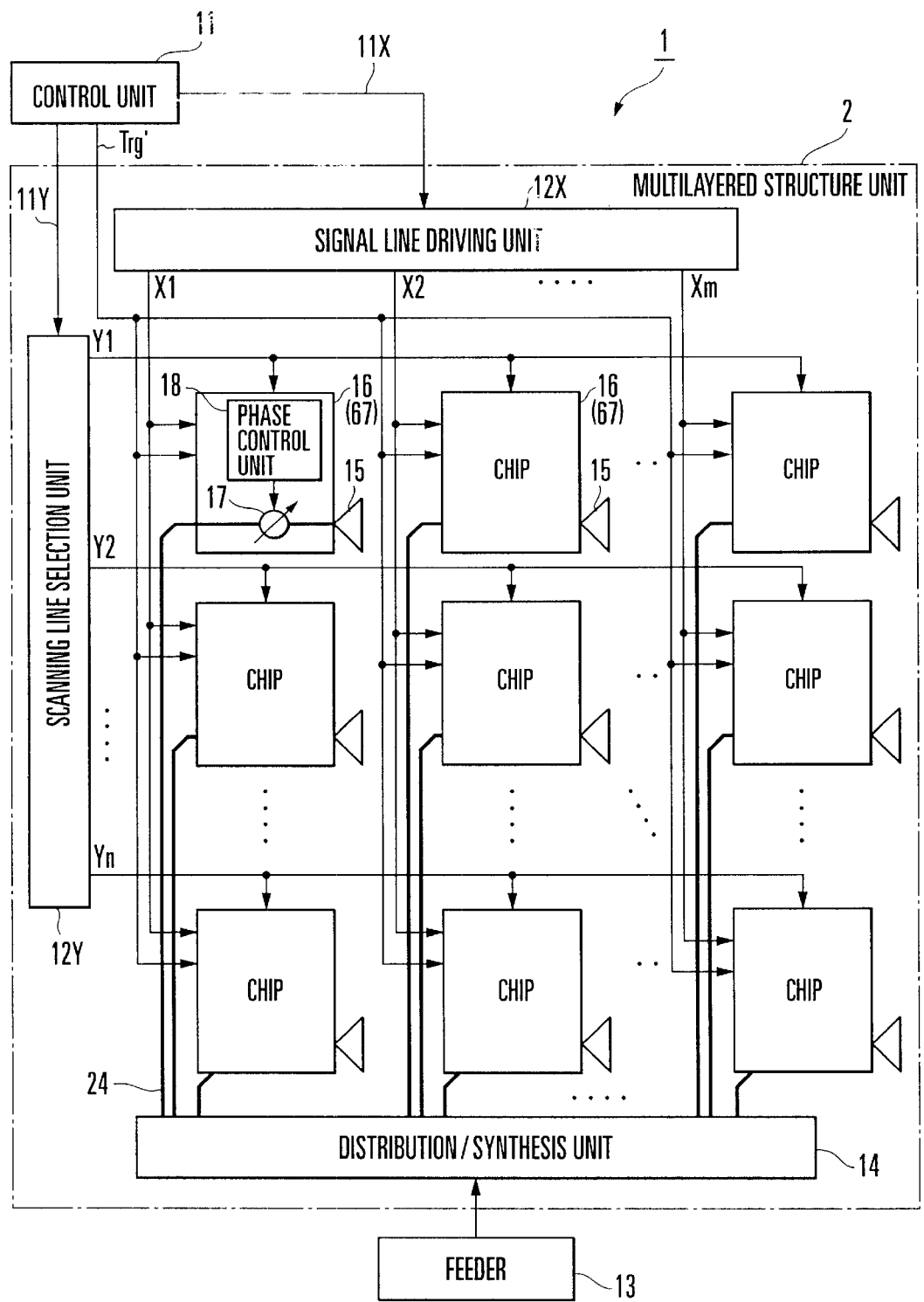
F I G. 1

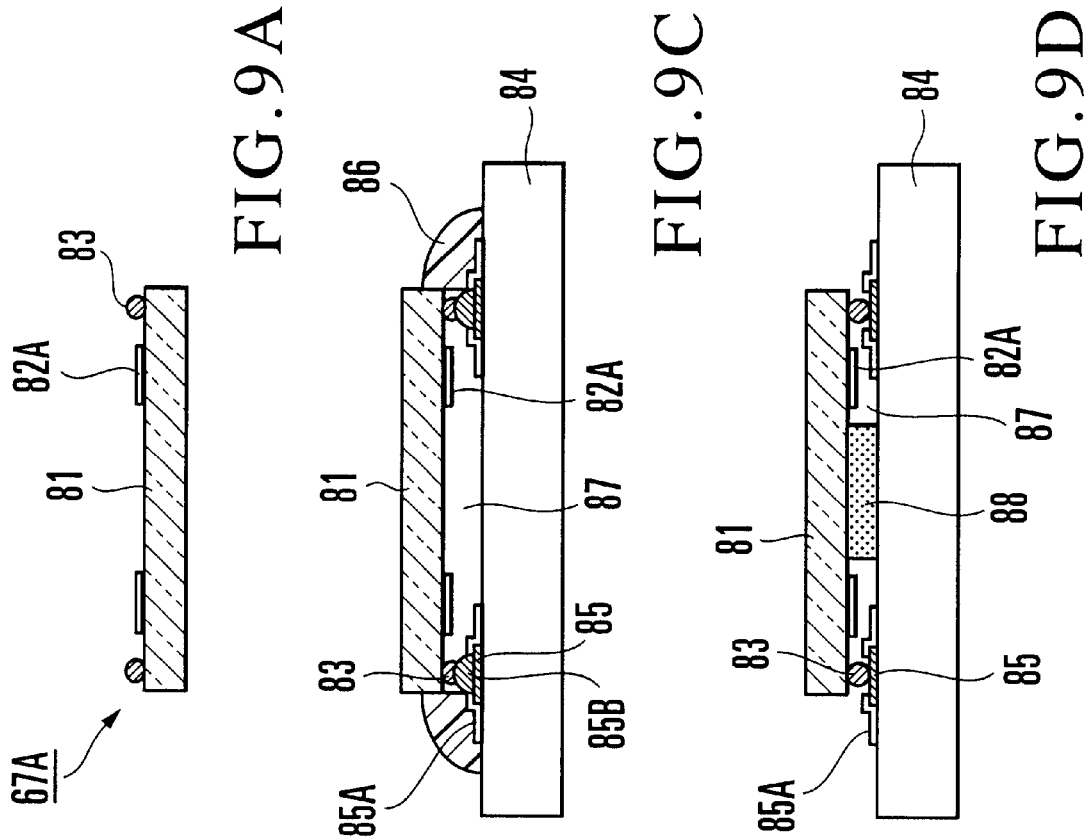

PHASED ARRAY ANTENNA AND ITS MANUFACTURING METHOD

TECHNICAL FIELD

The present invention relates to a phased array antenna used for transmitting/receiving an RF signal such as a microwave or milliwave to electrically adjust a beam radiation direction by controlling a phase supplied to each radiating element, and a method of manufacturing the antenna.

BACKGROUND ART

As a satellite tracking on-vehicle antenna or satellite borne antenna, a phased array antenna having many radiating elements arranged in an array has conventionally been proposed (see Technical Report AP90-75 of the Institute of Electronics, Information and Communication Engineers, and Japanese Patent Laid-Open No. 1-290301).

A phased array antenna of this type has a function of arbitrarily changing the beam direction by electronically changing the phase of a signal supplied to each radiating element.

As a means for changing the feed phase of each radiating element, a phase shifter is generally used.

As the phase shifter, a digital phase shifter (to be simply referred to as a phase shifter hereinafter) made up of a plurality of phase shift circuits having different fixed phase shift amounts is used.

The phase shift circuits are respectively ON/OFF-controlled by 1-bit digital control signals to combine the phase shift amounts of the phase shift circuits, thereby obtaining a feed phase of 0° to 360° by the whole phase shifter.

A conventional phased array antenna uses many components including semiconductor elements such as PIN diodes and GaAs FETs serving as switching elements in phase shift circuits, and driver circuit components for driving the semiconductor elements.

The phase shifter applies a DC current or DC voltage to these switching elements to turn them on/off, and changes the transmission path length, susceptance, and reflection coefficient to generate a predetermined phase shift amount.

Recently in the field of low earth orbit satellite communications, communications at high data rates are required along with the wide use of the Internet and the spread of multimedia communications, and the gain of the antenna must be increased.

To implement communications at high data rates, the transmission bandwidth must be increased. Because of a shortage of the frequency resource in a low-frequency band, an antenna applicable to an RF band equal to or higher than the Ka band (about 20 GHz or higher) must be implemented.

More specifically, an antenna for a low earth orbit satellite tracking terminal (terrestrial station) must satisfy technical performance:

Frequency: 30 GHz

Antenna gain: 36 dBi

Beam scanning range: beam tilt angle of 50° from front direction

To realize this by a phased array antenna, first, the aperture area: about 0.13 m$^2$ (360 mm×360 mm) is needed.

In addition, to suppress the side lobe, radiating elements must be arranged at an interval of about ½ wavelength (around 5 mm for 30 GHz) to avoid generation of the grating lobe.

To set a small beam scanning step and minimize the side lobe degradation caused by the quantization error of the digital phase shifter, the phase shift circuit used for the phase shifter is desirably made up of at least 4 bits (22.5° for the minimum-bit phase shifter).

The total number of radiating elements and the number of phase shift circuit bits used for a phased array antenna which satisfies the above conditions are given by Number of elements for the phase shift circuit: 72×72= about 5,000

Number of phase shift circuit bits: 72×72×4=about 20,000 bits

When a high-gain phased array antenna applicable to an RF band is to be implemented by, e.g., a phased array antenna disclosed in Japanese Patent Laid-Open No. 1-290301 shown in FIG. 19, the following problems occur.

More specifically, a conventional phased array antenna controls phase shift circuits in each phase shifter by one driver circuit formed on a driver circuit substrate, as shown in FIG. 19. For this purpose, the driver circuit must be connected to all the phase shift circuits.

This requires connection wiring lines equal in number to the number of radiating elements×the number of phase shift circuit bits. If the above numerical values are applied, the number of wiring lines to phase shift circuits (4 bits) for one line (72 radiating elements) is 72×4=288 in an array of 72×72 radiating elements.

If these wiring lines are formed on a single plane, the width of a wiring line bundle for one line (72 radiating elements) is 0.1 mm×288=28.8 mm for the wiring line width/wiring line interval (L/S)=50/50 μm.

To the contrary, in a phased array antenna applicable to a frequency of 30 GHz, radiating elements must be arranged at an interval of around 5 mm, as described above. In the prior art, however, the wiring line bundle is as thick as 28.8 mm, so radiating elements cannot be physically arranged.

Accordingly, such a prior art implements no high-gain phased array antenna applicable to an RF band.

The present invention has been made to solve the above problems, and has as its object to provide a high-gain phased array antenna applicable to an RF band.

DISCLOSURE OF INVENTION

To achieve the above object, in a phased array antenna according to the present invention, radiating elements and phase control means are individually formed on a radiating element layer and phase control layer, respectively, to form a multilayered structure as a whole, and the phase control means are phase-controlled by using signal lines and scanning lines arranged in a matrix. With this structure, the radiating elements are eliminated from the phase control layer, thereby reducing an area in the phase control layer which is to be occupied by the radiating elements. In addition, since the wiring lines of the signal line and scanning line for phase control are shared by the plurality of phase control means, the number of signal wiring lines can be greatly reduced.

Further, each driver circuit included in a phase shift unit is formed from a thin-film transistor on a glass substrate, a micromachine switch is used in a phase shift circuit, and the driver circuit and the micromachine switch are housed in a single chip. This reduces an area occupied by these circuit components as compared with the prior art.

Accordingly, since one phase shift unit is formed in a relatively small area, many radiating elements are arranged, in units of several thousands, at an interval (around 5 mm)

which is optimal for an RF signal of about 30 GHz. This can implement a high-gain phased array antenna applicable to an RF band.

Furthermore, circuit portions repeatedly arranged in each phase control means, are mounted on first substrates, and the first substrates are mounted on a second substrate on which a phase control layer is formed. This reduces the number of components and the number of connections as compared with the conventional case wherein the circuit components are individually mounted.

With this structure, the number of assembling processes can decrease, and defect inspection can be executed in units of chips, and a yield in the entire phased array antenna can be improved. In particular, the manufacturing cost can be greatly reduced in a high-gain phased array antenna comprised of phase shift units arranged in units of several thousands.

BRIEF DESCRIPTION OF DRAWINGS

FIG. 1 is a block diagram of a phased array antenna according to an embodiment of the present invention;

FIG. 9 shows views for explaining examples of mounting a bare chip;

BEST MODE OF CARRYING OUT THE INVENTION

Figure 2:
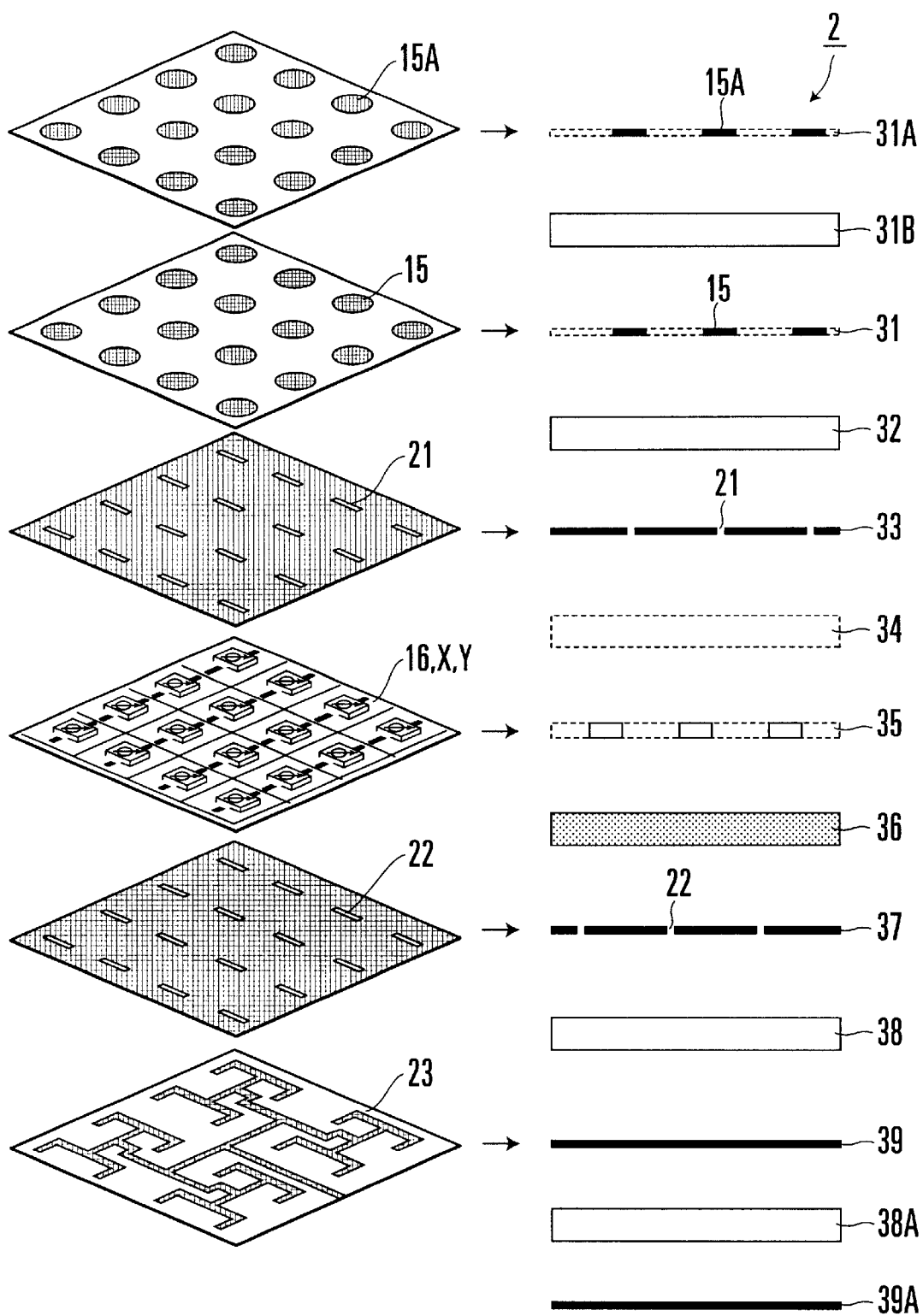
FIG. 2 is a view for explaining a multilayered substrate structure.

The present invention will be described below with reference to the accompanying drawings.

FIG. 1 is a block diagram of a phased array antenna 1 according to an embodiment of the present invention.

In the following description, a phased array antenna is used as an RF signal transmission antenna. However, the phased array antenna is not limited to this, and can be used as an RF signal reception antenna for the same operation principle based on the reciprocity theorem.

In addition, when a whole antenna is made up of a plurality of subarrays, the present invention may be applied to a phased array antenna of each subarray.

FIG. 1 is a view for explaining the arrangement of the phased array antenna 1.

Referring to FIG. 1, the phased array antenna 1 is made up of a multilayered substrate unit 2 on which antenna radiating elements, phase control circuits, and the like are mounted on a multilayered substrate, a feeder 13 for feeding RF power to the multilayered substrate unit 2, and a control unit 11 for controlling the phase of each radiating element of the multilayered substrate unit 2.

In FIG. 1, m×n (m and n are integers of 2 or more) radiating elements 15 are arranged in an array, and RF signals are supplied to the radiating elements 15 from the feeder 13 via a distribution/synthesis unit 14 and strip lines 24 (thick lines in FIG. 1).

Note that, the radiating elements 15 may be arranged in a rectangular matrix shape or any other shape such as a triangular shape.

Each radiating element 15 has a phase shifter 17 and a phase controller 18 for controlling the phase shifter 17.

In the following description, the phase shifter 17 arranged for each radiating element 15, part of a strip line connected to the phase shifter 17, and the phase controller 18 will be referred to as a phase shift unit 16.

In a circuit constituting the phase shift unit or units 16, circuit portions repeatedly arranged between the phase shift units 16 or in a single phase shift unit 16 are formed into a single chip formed on another substrate on which a phase control layer 35 to be described later is mounted.

In the present specification, a small piece (first substrate) cut from a substrate on which a large number of identical or similar circuits are simultaneously formed by a semiconductor process or the like is called a bare chip. A device obtained by processing for mounting a bare chip on another substrate (second substrate) is called a chip.

To obtain a final chip, cutting of a large number of simultaneously formed circuits in unit circuits and processing for mounting the bare chip on another substrate are called chip formation.

The control unit 11 calculates the feed phase shift amount of each radiating element 15 on the basis of a desired beam radiation direction.

The calculated phase shift amount of the radiating element 15 is output from the control unit 11 to a signal line driver 12X and scanning line selector 12Y by control signals 11X and 11Y.

Signal lines X1 to Xm serving as outputs of the signal line driver 12X and scanning lines Y1 to Yn serving as outputs of the scanning line selector 12Y are connected to the phase controller 18 in a matrix.

In the signal line driver 12X and scanning line selector 12Y, therefore, the phase shift amounts of the radiating elements 15 are individually set for the phase controller 18 by performing matrix driving (to be described later) based on the control signals 11X and 11Y.

A trigger signal Trg' determines a timing in which each phase shift amount set in the phase controller 18 is designated and output to a corresponding phase shifter 17.

Therefore, after the phase shift amounts are respectively set in the phase controllers 18, the controller 11 outputs the trigger signal Trg' to simultaneously update the feed phase shift amounts to the respective radiating elements 15, thereby instantaneously changing the beam radiation direction.

Alternately, the trigger signal Trg' is always output to sequentially update the feed phases to the respective radiating elements 15.

In this case, the phase shifter 17 is not simultaneously switched but is partially switched, which avoids a hit of a radiation beam.

The multilayered substrate unit 2 of the phased array antenna according to this embodiment will be described next with reference to FIG. 2.

FIG. 2 is a view for explaining the arrangement of a multilayered substrate, which shows perspective views of layers and schematic views of sections.

The layers are patterned by photolithography, etching, or printing and stacked and integrated into a multilayer.

The stacking order of the respective layers is not necessarily limited to the one shown in FIG. 2. Even if the stacking order partially changes due to deletion or addition depending on the electrical/mechanical requirement, the present invention is effective.

A branch-like strip line 23 for distributing RF signals applied from the feeder 13 in FIG. 1 (not shown in FIG. 2) is formed on a distribution/synthesis layer 39.

The strip lines 23 can use a tournament scheme in which two branches are repeated or a series distribution scheme for gradually branching the main line in comb-like teeth.

A dielectric layer 38A and a ground layer 39A made of a conductor are added outside the distribution/synthesis layer 39 in accordance with a mechanical design condition such a mechanical strength or an electrical design condition such as unnecessary radiation suppression.

A coupling layer 37 (second coupling layer) is formed above the distribution/synthesis layer 39 through a dielectric layer 38.

The coupling layer 37 is comprised of a conductive pattern in which holes, i.e., coupling slots 22 are formed on a ground plane.

A phase control layer 35 is formed above the coupling layer 37 through a dielectric layer 36.

The phase control layer 35 has the phase shift units 16, and wiring lines X1 to Xm and wiring lines Y1 to Yn for individually controlling the phase shift units 16.

A coupling layer 33 (first coupling layer) having coupling slots 21 as in the coupling layer 37 is formed above the phase control layer 35 through a dielectric layer 34.

A radiating element layer 31 having the radiating elements 15 is formed above the coupling layer 33 through a dielectric layer 32.

However, passive elements 15A are added to widen the band, and may be arranged as needed.

Each of a dielectric layer 31B, the dielectric layer 32, and the dielectric layer 38 is made of a substrate having low relative dielectric constant of about 1 to 4, e.g., a printed board, glass substrate, or foaming material.

These dielectric layers may be spaces (air layers).

As the dielectric layer 36, a substrate having high relative dielectric constant of about 5 to 30, e.g., a ceramics substrate made of alumina or the like, a glass substrate, or a printed board with a high dielectric constant can be used.

As the dielectric layer 34, a substrate having relative dielectric constant of about 1 to 11, e.g., a printed board, ceramics substrate, glass substrate, or foaming material can be used.

In particular, since circuit portions formed into single chips are mounted on the phase control layer 35, a space (air layer) may be formed as the dielectric layer 34.

For the sake of descriptive simplicity, the respective layers constructing the multilayered substrate portion 2 are separately described in FIG. 2. However, a layer adjacent to each of the dielectric layers 31B, 32, 34, 36, 38, and 38A, e.g., the radiating element layer 31 or the coupling layer 33 is realized by patterning it on one or two sides of the dielectric layer.

The aforementioned dielectric layer is not made of a single material and may have an arrangement in which a plurality of materials are stacked.

In the multilayered structure unit 2 described above, the RF signal from the feeder 13 (not shown in FIG. 2) propagates from the strip line 23 of the distribution/synthesis layer 39 to the strip lines of the phase control layer 35 via the coupling slots 22 of the coupling layer 37.

The RF signal is then given a predetermined feed phase shift amount in the phase shifter 17 and propagates to the radiating elements 15 of the radiating element layer 31 via the coupling slots 21 of the coupling layer 33 to radiate from each radiating element 15 to a predetermined beam direction.

As described above, in the circuits (i.e., the phase shifter 17 and phase controller 18 formed for each radiating element) constructing each phase shift unit 16, identical circuit portions used between the phase shift units 16 or in a single phase shift unit 16 are mounted on the phase control layer 35 as a chip 67.

As will be described later, various types of regions of a circuit which is to be formed into a single chip are considered, however, FIG. 1 shows a case wherein the whole phase shift unit 16 is formed on a shingle chip.

The signal line driver 12X and scanning line selector 12Y are arranged in a region, of the phase control layer 35, outside the multilayered structure region, and the wiring patterns of the signal lines X1 to Xm and Y1 to Yn for electrically connecting the signal line driver 12X and scanning line selector 12Y to each phase controller 18 are also formed on the phase control layer 35.

Wiring patterns for the trigger signal line Trg and power and ground patterns for all types of circuits are also formed on the phase control layer 35.

The signal lines X1 to Xm and scanning lines Y1 to Yn are formed on the phase control layer 35 so as to intersect and connect the phase controllers 18 in a matrix.

As will be described later, the signal line driver 12X sequentially sends the driving signal via the signal lines X1 to Xm while the scanning line selector 12Y sequentially selects the scanning lines Y1 to Yn, so that desired phase shift amounts are set to the phase controllers 18 located on the intersections between the signal lines and the scanning lines.

In the present invention, each circuit portion repeatedly arranged between the phase shift units 16 or in a single phase shift unit 16 is formed into a single chip on another substrate (a first substrate), and the chips are mounted on a substrate (second substrate) on which the phase control layer 35 is formed.

Consequentially, the defect inspection can be executed in units of chips, and a yield in the entire phased array antenna can be improved. In particular, the manufacturing cost can be greatly reduced in a high-gain phased array antenna comprised of phase shift units arranged in units of several thousands.

Also, in the present invention, the phase controllers 18 are connected in a matrix by the signal lines X1 to Xm and the scanning lines Y1 to Yn, and the signal lines X1 to Xm and the scanning lines Y1 to Yn are matrix-driven, thereby setting desired phase shift amounts to the phase controllers 18 located at intersections between the signal lines and the scanning lines.

With this arrangement, the signal wiring lines for controlling the phase controllers 18 can be shared, and the number of the wiring lines and the area need for these wiring lines can be greatly reduced.

In the present invention, the radiating elements 15 and the phase shift units 16 are individually formed on the radiating element layer 31 and the phase control layer 35, respectively, and both layers are coupled by the coupling layer 33 to form the multilayered structure as a whole.

In addition, the distribution/synthesis unit 14 is individually formed on the distribution/synthesis layer 39, and the phase control layer 35 and distribution/synthesis layer 39 are coupled by the coupling layer 37 to form the multilayered structure as a whole.

This reduces the area, of the phase control layer 35, which is to be occupied by the radiating elements 15 and distribution/synthesis unit 14 and can make an area per radiating element small.

Accordingly, one phase shift unit 16 is formed in a relatively small area. For this reason, e.g., for the RF signal of about 30 GHz, the radiating elements 15 can be arranged at an optimum interval of around 5 mm, thereby realizing the high-gain phased array antenna applicable to an RF band.

In addition, a beam scanning angle in which the grating lobe is generated is made large by realizing the optimum element interval, thereby scanning a beam within a wide range centered on the front direction of the antenna.

As the strip line used in the present invention, a triplet type, coplanar waveguide type, slot type, or the like as well as a microstrip type distributed constant line can be used.

As the radiating element 15, a printed dipole antenna, slot antenna, aperture element or the like as well as a patch antenna can be used. In particular, the opening of the coupling slot 21 of the coupling layer 33 is made large, which is usable as a slot antenna. In this case, the coupling layer 33 also serves as the radiating element layer 31, and the radiating element layer 31 and a passive element layer 31A can be omitted.

In place of the coupling slots 21, conductive feed pins for connecting the strip lines of the phase control layer 25 and the radiating elements 15 may be used to couple the RF signals.

Further, in place of the coupling slots 22, conductive feed pins projecting from the strip lines of the phase control layer 35 to the dielectric layer 38 through holes formed in the coupling layer 37 may be used to couple the RF signals.

The same function as that of the distribution/synthesis layer 39 can also be realized even if a radial waveguide is used.

Figure 3:
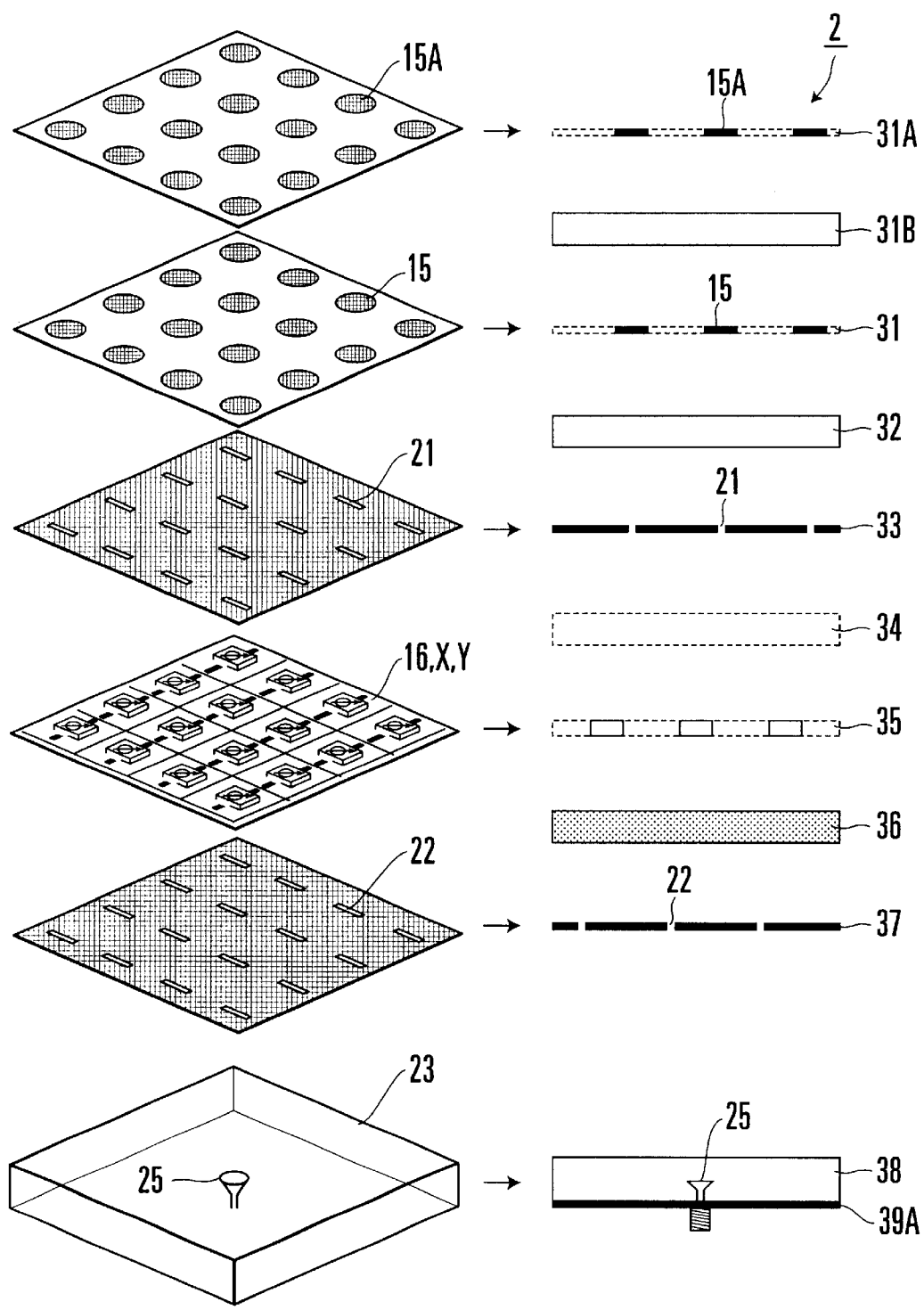
FIG. 3 is a view for explaining a multilayered substrate structure according to another embodiment of the present invention.

FIG. 3 is a view for explaining the arrangement of the present invention when using the radial waveguide.

In this case, a distribution/synthesis function is realized by a dielectric layer 38, ground layer 39A, and probe 25 of a multilayered substrate unit 2 shown in FIG. 3, and a distribution/synthesis layer 39 required in FIG. 2 can be omitted.

In this case, the dielectric layer 38 is also made of a printed board, glass substrate, foaming agent, or space (air layer).

As the ground layer 39A, the copper foil on a printed board may be directly used, or a metal plate or a metal enclosure for enclosing all the side surfaces of the dielectric 38 may be separately arranged.

The present invention can also be applied to a space-fed phased array antenna.

Figure 4:
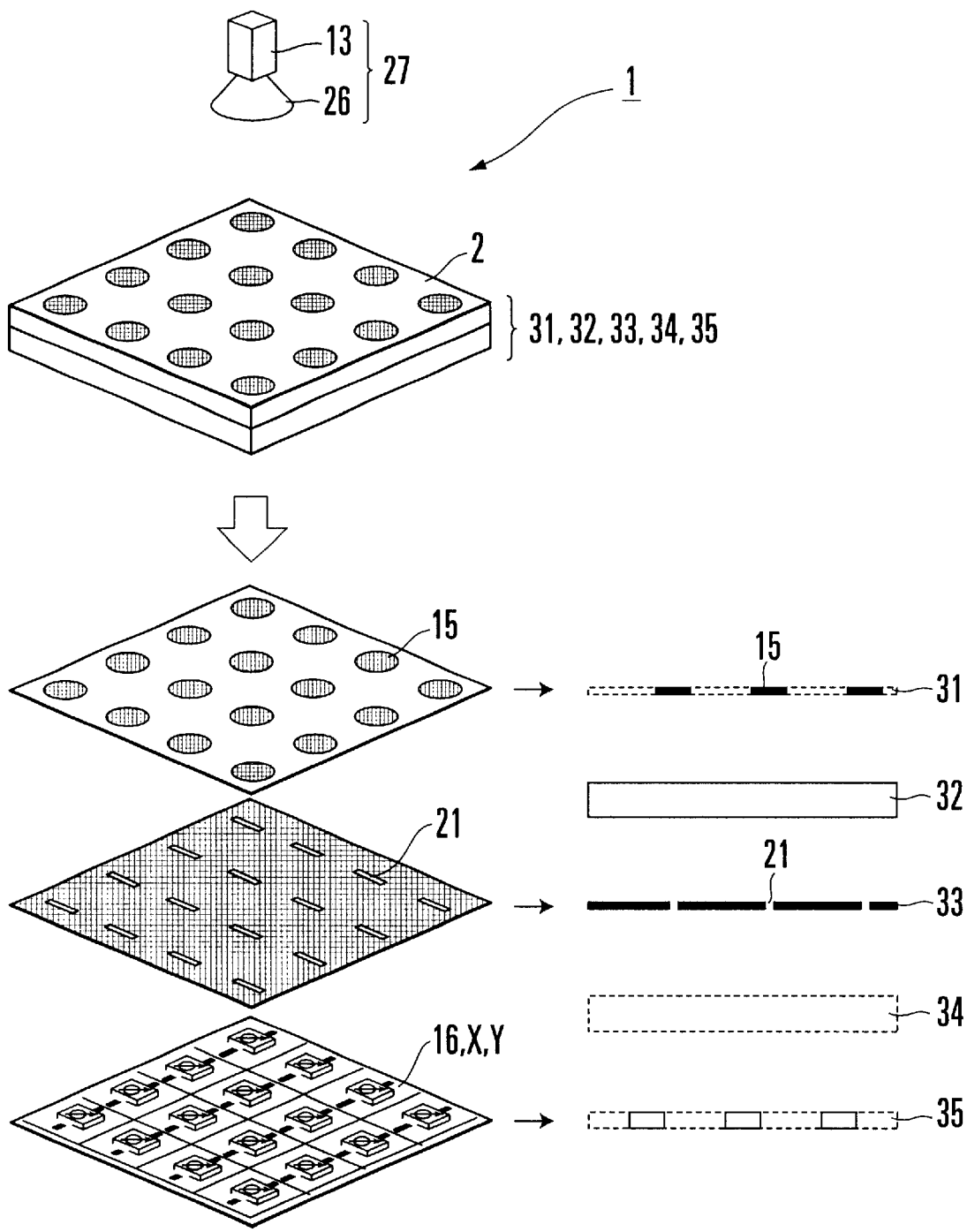
FIG. 4 is a view for explaining a multilayered substrate structure according to still another embodiment of the present invention.

FIG. 4 shows the arrangement of a reflection-type space-fed phased array antenna as an example.

A phased array antenna 1 shown in FIG. 4 is made up of a feeder 13, a radiation feeder 27 having a primary radiation unit 26, a multilayered substrate unit 2, and a control unit 11 (not shown).

In this structure, the multilayered substrate unit 2 has a structure different from that shown in FIG. 2, which is constructed by a radiating element layer 31, dielectric layer 32, coupling layer 33, dielectric layer 34, and phase control layer 35.

The function of the distribution/synthesis unit 14 shown in FIG. 1 is realized by the primary radiation unit 26 so that a distribution/synthesis layer 39 is excluded from the multilayered substrate unit 2.

In the phased array antenna 1, an RF signal radiated from the radiation feeder 27 is temporarily received by each radiating element 15 on the radiating element layer 31, and is coupled to each phase shift unit 16 on the phase control layer 35 via the coupling layer 33.

After the phase of the RF signal is controlled by each phase shift unit 16, the RF signal propagates to each radiating element 15 again via the coupling layer 33, and radiates from each radiating element 15 in the predetermined beam direction.

The present invention is effective even for the space-fed phased array antenna as described above which includes no distribution/synthesis layer 39 in the multilayered substrate unit 2.

The phase shift unit 16 formed for each radiating element 15 will be described next with reference to FIG. 5.

Figure 5:
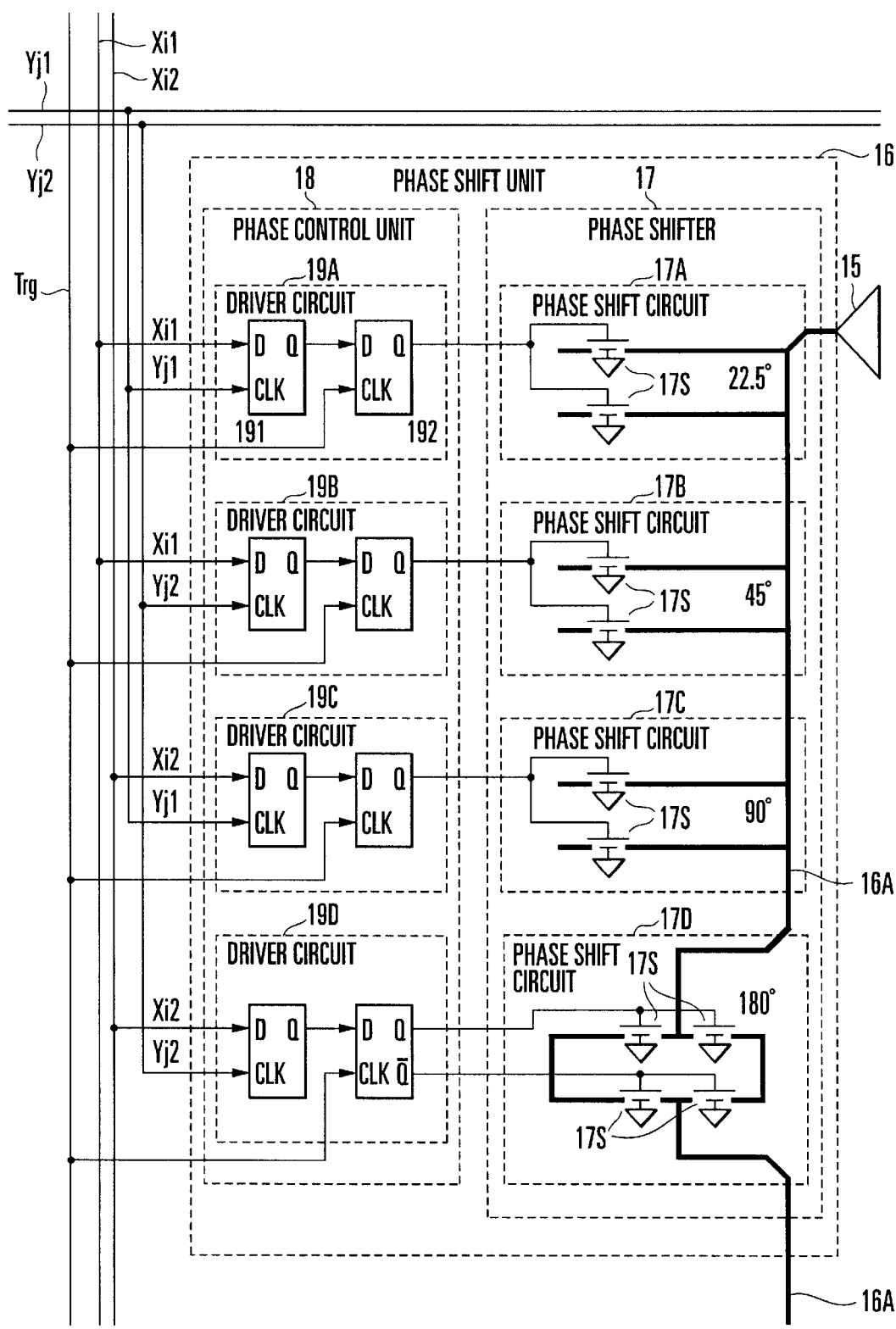
FIG. 5 is a block diagram showing a phase shift unit.

FIG. 5 is a block diagram showing the phase shift unit. In this case, the phase shifter 17 is comprised of four phase shift circuits 17A to 17D having different phase shift amounts of 22.5°, 45°, 90°, and 180°.

The phase shift circuits 17A to 17D are connected to a strip line 16A for propagating an RF signal from the distribution/synthesis unit 14 to the radiating element 15.

Each of the phase shift circuits 17A to 17D has a switch 17S.

By switching the internal switches of the switch 17S, a predetermined feed phase shift amount is supplied, as will be described below.

The phase controller 18 for individually controlling the switches 17S of the phase shift circuits 17A to 17D is constituted by driver circuits 19A to 19D respectively arranged for the phase shift circuits 17A to 17D.

Each of the driver circuits 19A to 19D has two series-connected latches 191 and 192.

Of these latches, the latches (first latches) 191 latch the levels of signal lines Xi connected to the inputs D at the leading edge timings of scanning lines Yi connected to the inputs CLK.

The latches (second latches) 192 latch the outputs Q of the latches 191 at the leading edge of the trigger signal Trg' supplied to the inputs CLK, and output the outputs Q to the switches 17S of corresponding phase shift circuits.

In FIG. 5, two signal lines Xi1 and Xi2 and two scanning lines Yj1 and Yj2 are laid out for one phase controller 18, and ON/OFF data of the respective switches are individually set in the four driver circuits 19A to 19D.

That is, Xi1 and Yj1 control the operation of the phase shift circuit 17A; Xi1 and Yj2, that of the phase shift circuit 17B; Xi2 and Yj1, that of the phase shift circuit 17C; and Xi2 and Yj2, that of the phase shift circuit 17D.

Figure 6:
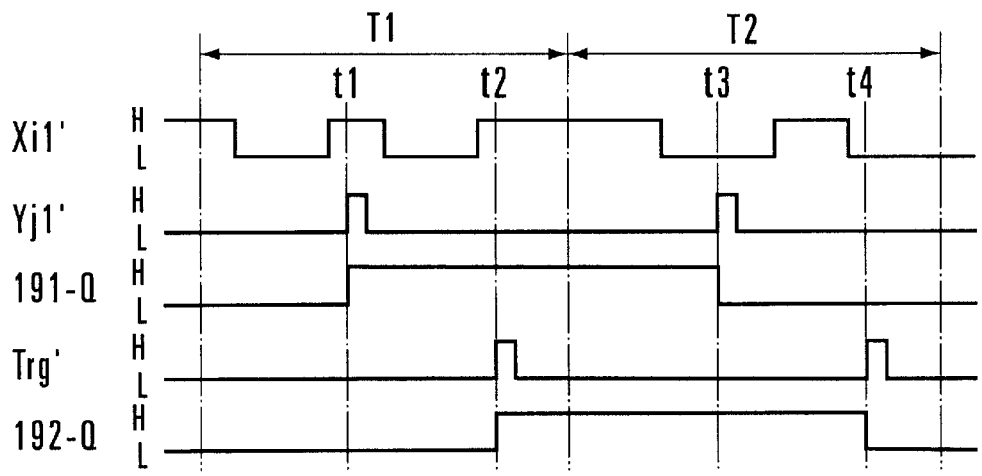
FIG. 6 is a timing chart showing an operation of a phase controller.

FIG. 6 is a timing chart showing the operation of the phase controller by exemplifying the driver circuit 19A corresponding to the phase shift circuit 17A.

The signal line driver 12X always changes because the signal line driver 12X supplies not only a signal for the driver circuit 19A as a driving signal applied to the signal line Xi1 in FIG. 5, but also signals for other driver circuits connected to the signal line Xi1, i.e., the driver circuit 19B of the same phase controller 18 and the driver circuit of another phase controller 18.

Figure 7:
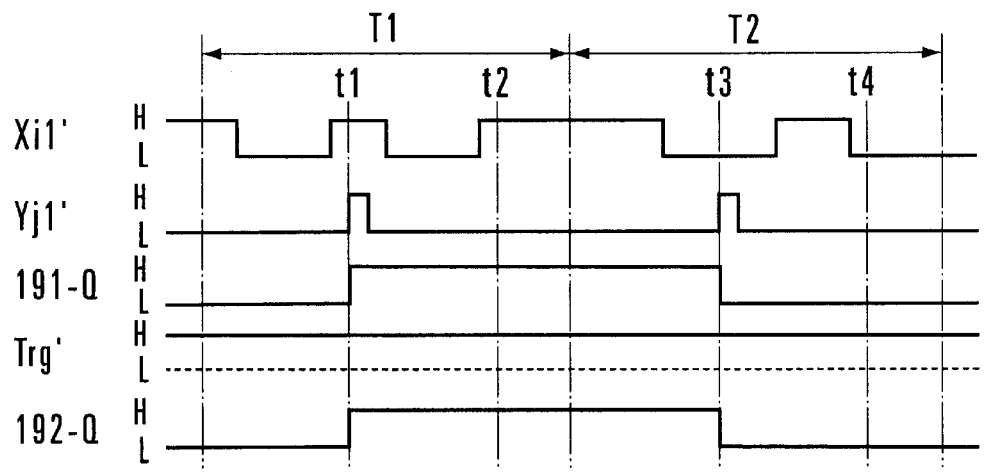
FIG. 7 is a timing chart showing another operation of the phase controller.

Since the scanning line selector 12Y sequentially selects Y11 to Yn2 one by one during a period T1, the scanning line Yj1 receives a pulse only once during the period T1 (t1 in FIG. 7).

When a scanning line voltage Yj1' changes to high level at time t1 during the period T1, the level of a signal line voltage Xi1', i.e., high level, is output from the output Q of the latch 191. This state is held even after the scanning line voltage Yj1' returns to low level.

After that, when the trigger signal Trg' changes to high level at time t2, the output Q of the latch 191 is output from the output Q of the latch 192. This state is held even after the trigger signal Trg' returns to low level.

Accordingly, the switch 17S of the phase shift circuit 17A is kept on from t2 to t4 (at which the trigger signal Trg' is applied next) during which a feed phase of +22.5° is applied to an RF signal propagating through the strip line 24.

During the period T2, the low level of the signal line voltage Xi1' is latched by the latch 191 at time t3, and by the latch 192 at time t4.

Then, the switch 17S of the phase shift circuit 17A is kept off, and the feed phase shift amount to an RF signal propagating through the strip line 16A returns to 0°.

As shown in FIG. 7, the trigger signal Trg' may always be kept high. In this case, the latch output Q of the latch 191 is quickly transferred to the latch 192, and output to the switch 17S.

By sequentially switching the switches 17S, a hit of a radiation bean caused by a switching time can be avoided, and stable operation can always be ensured.

If the output voltage or current of the latch 192 is not high enough to drive the switch 17S, a voltage amplifier or current amplifier may be arranged on the output side of the latch 192.

A structure of the switch 17S will be described with reference to FIG. 8 while using an example of practical sizes.

Figure 8:
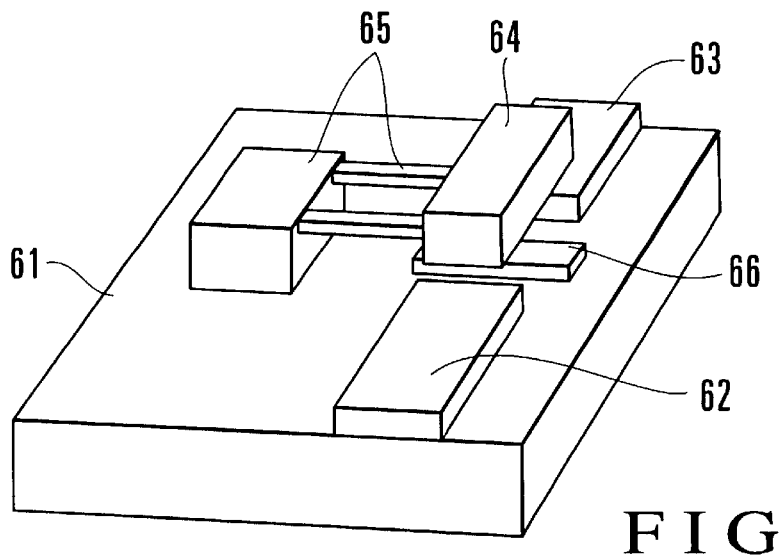
FIG. 8 is a perspective view showing a structure of a switch.

FIG. 8 is a perspective view showing the structure of the switch.

This switch is comprised of a micromachine switch for short-circuiting/releasing strip lines 62 and 63 by a contact (small contact) 64. The "micromachine switch" means a small switch suitable for integration by a semiconductor device manufacturing process.

The strip lines 62 and 63 (about 1 μm thick) are formed on a substrate 61 at a small gap. The contact 64 (about 2 μm thick) is supported by a support member 65 above the gap so as to freely contact the strip lines 62 and 63.

The distance between the lower surface of the small contact 64 and the upper surfaces of the strip lines 62 and 63 is about 4 μm. The level of the upper surface of the small contact 64 from the upper surface of the substrate 61, i.e., the height of the whole micromachine switch is about 7 μm.

A conductive electrode 66 (about 0.2 μm thick) is formed at the gap between the strip lines 62 and 63 on the substrate 61. The height (thickness) of the electrode 66 is smaller than that of the strip lines 62 and 63.

The operation of the switch will be explained.

The electrode 66 receives an output voltage (e.g., about 10 to 100 V) from a corresponding one of the driver circuits 19A to 19D.

When a positive output voltage is applied to the electrode 66, positive charges are generated on the surface of the electrode 66. At the same time, negative charges appear on the surface of the facing contact 64 by electrostatic induction, and are attracted to the strip lines 62 and 63 by the attraction force between the positive and negative charges.

Since the contact 64 is longer than the gap between the strip lines 62 and 63, the contact 64 contacts both the strip lines 62 and 63, and the strip lines 62 and 63 are electrically connected in a high-frequency manner through the contact 64.

When application of the output voltage to the electrode 66 stops, the attraction force disappears, and the contact 64 returns to an original apart position by the support member 65 to release the strip lines 62 and 63.

In the above description, the output voltage is applied to the electrode 66 without applying any voltage to the contact 64. However, the operation may be reversed.

That is, the output voltage of the driver circuit may be applied to the contact 64 via the conductive support member 65 without applying any voltage to the electrode 66. Even in this case, the same effects as those described above can be attained.

At least the lower surface of the contact 64 may be formed from a conductor so as to ohmic-contact the strip lines 62 and 63. Alternatively, an insulating thin film may be formed on the lower surface of the conductive member so as to capacitively couple the strip lines 62 and 63.

In the micromachine switch, the contact 64 is movable. When the phase control layer 35 is formed on a multilayered substrate as in the phased array antenna in this invention, a space for freely moving the contact 64 must be defined.

In this manner, since the micromachine switch is used as the switching element for controlling the feed phase, the power consumption at the semiconductor junction can be eliminated as compared with the use of a semiconductor device such as a PIN diode. This makes it possible to reduce the power consumption to about 1/10.

The arrangement of the chip and a mounting form will be explained.

FIG. 9 shows views for explaining arrangements in a case wherein a bare chip 68 is flip-chip-mounted, in which FIG. 9(*a*) is a sectional view of a chip 67A, FIG. 9(*b*) is a plan view, seen from above, of the chip 67A, FIG. 9(*c*) is a sectional view of face-down mounting (a soldering method)

of the chip 67A, and FIG. 9(d) is a sectional view of face-down mounting (an adhering method) of the chip 67A.

Various types of regions of a circuit included in the chip 67A are considered, as will be described later using FIG. 11. However, a case wherein the circuit portion components shown in FIG. 11(b), i.e., a driver circuit and switches are formed into a single chip will be explained below.

As shown in FIGS. 9(a) and 9(b), as the bare chip 68, switches 82A made up of micromachine switches and a driver circuit 82B formed from a thin-film transistor (TFT) are formed on a glass substrate 81.

Bumps 83 made of solder or gold are formed on pads for signal connection on the bare chip 68, thereby obtaining the chip 67A.

FIG. 9(c) shows a case wherein the chip 67A is mounted facing down on another substrate 84 by soldering. Each of pads 85 for signal connection, whose periphery is covered with an insulating protective film 85A, is formed on the substrate 84.

The pad 85 and the bump 83 are fixed by soldering through a bump 85B and electrically connected to each other.

In this case, each of the resultant heights of pad 85, bump 85B, and bump 83 is set at 20 μm so that a space 87 having the height of 40 μm is formed around the switch 82A having a movable portion upon final mounting, thereby stably operating the micromachine switch.

The entire periphery or its part of the substrate 81 is fixed with the substrate 84 by a resin 86.

This protects the bonded portion of the bump 85 even if a mechanical stress acts on the substrate 84.

FIG. 9(d) shows a case wherein the chip 67A is mounted facing down on another substrate 84 by adhesion. Each of the pads 85 for signal connection, whose periphery is covered with the insulating protective film 85A, is formed on the substrate 84.

The glass substrate 81 and the substrate 84 are adhered through an adhesive 88, and the pad 85 and bump 83 directly contact and are electrically connected to each other.

In this case, the adhesive 88 is arranged outside the mounting region of the switch 82A, and connects the glass substrate 81 to the substrate 84.

Therefore, the space 87 is formed around the switches 82A each having the movable portion, thereby stably operating the micromachine switch.

The glass substrate 81 and the substrate 84 are adhered with the adhesive 88 within the relatively wide range. This protects the bonded portion of the bump 83 even if a mechanical stress acts on the substrate 84.

In this manner, a predetermined circuit portion of the phase shift unit 16, which includes the switching elements, is formed into a single chip and mounted on the phase control layer 35, thereby mounting the switching element with the relatively simple arrangement.

In addition, defect inspection can be executed for a single chip before the chip is mounted on the phase control layer 35, thereby improving the yield of the entire apparatus.

In particular, since the bare chip is flip-chip-mounted, the height required in the phase control layer 35 can be suppressed, thereby improving a coupling efficiency between the phase control layer 35 and the radiating element 15 coupled through the slot 21.

Figure 10A:
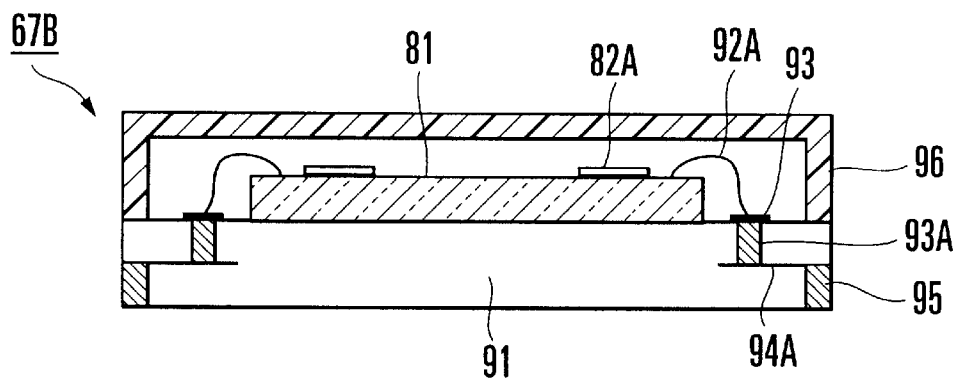
FIG. 10 shows views for explaining examples of packaging a chip.
Figure 10B:
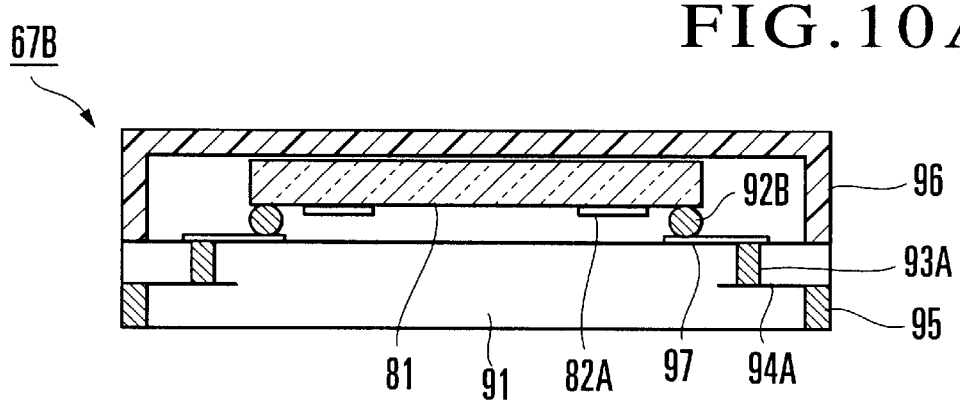
Figure 10C:
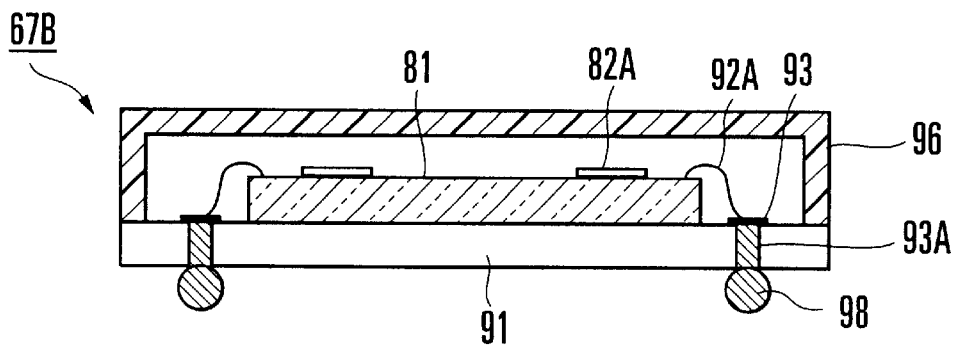

FIG. 10 shows views of a case wherein the bare chip is packaged, in which:

FIG. 10(a) is a sectional view of LCC packaging by face-up mounting;

FIG. 10(b) is a sectional view of LCC packaging by face-down mounting;

FIG. 10(c) is a sectional view of BGA packaging by face-up mounting; and

Figure 10D:
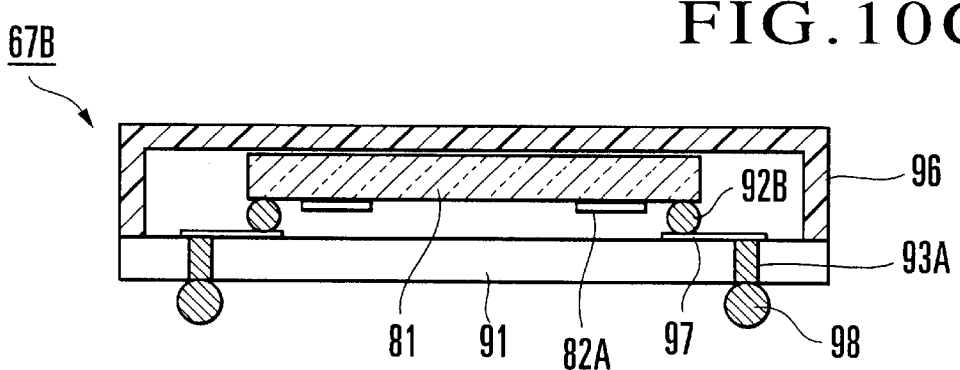

FIG. 10(d) is a sectional view of BGA packaging by face-down mounting.

A case wherein the bare chip 68 shown in FIGS. 9(a) and 9(b) is packaged will be explained next.

FIG. 10(a) shows a case wherein the bare chip 68 is packaged in an LCC (Leadless Chip Carrier) by face-up-mounting the bare chip 68, in which an LCC substrate 91 is adhered to the lower surface of the glass substrate 81 of the bare chip 68.

In this case, the pattern on the glass substrate 81 is electrically connected to electrodes 93 of the substrate 91 through leads 92A in place of the bumps 83 shown in FIG. 9.

The electrodes 93 are electrically connected to external terminals 95 through via holes 93A and patterns 94A in the substrate 91.

A cover 96 having a height (an internal size) of 80 μm to 100 μm is fixed and sealed on the substrate 91 so as to form an upper space for the movable portions of the micromachine switches of the switches 82A.

FIG. 10(b) shows a case wherein the bare chip 68 is packaged in the LCC by face-down mounting, in which the glass substrate 81 is fixed on the substrate 91 through bumps 92b similar to the bumps 83 shown in FIG. 9, and the pattern on the glass substrate 81 is electrically connected to patterns 97 of the substrate 91.

The patterns 97 are electrically connected to the external terminals 95 through the via holes 93A and the patterns 94A in the substrate 91.

The cover 96 is fixed and sealed on the substrate 91 so as to cover the lower surface of the glass substrate 81.

In this case, a space for the movable portion of the micromachine switches of the switches 82A is formed by the bumps 92B each having the height of 20 μm between the glass substrate 81 and the substrate 91.

FIG. 10(c) shows a case wherein the bare chip 68 is packaged in a BGA (Ball Grid Array) by face-up mounting, in which the lower surface of the glass substrate 81 of the bare chip is adhered on the substrate 91 of the BGA.

In this case, the pattern on the glass substrate 81 is electrically connected to the electrodes 93 of the substrate 91 through the leads 92A in place of the bumps 83 shown in FIG. 9.

The electrodes 93 are electrically connected to balls 98 through the via holes 93A in the substrate 91.

The cover 96 is fixed and sealed on the substrate 91 so as to form an upper space for the movable portions of the micromachine switches of the switches 82A.

FIG. 10(d) shows a case wherein the bare chip 68 is packaged in the BGA by face-down mounting, in which the glass substrate 81 is fixed on the substrate 91 through the bumps 92B similar to the bumps 83 shown in FIG. 9, and the pattern on the glass substrate 81 is electrically connected to the patterns 97 of the substrate 91.

The patterns 97 are electrically connected to the via holes 93. The balls 98 for external connection are formed outside the via holes 93A.

The cover 96 is fixed and sealed on the substrate 91 so as to cover the lower surface of the glass substrate 81.

In this case, a space for the movable portion of the micromachine switch comprised of the switch 82A is formed by the bump 92B between the glass substrate 81 and the substrate 91.

Each chip 67B packed in the LCC or BGA is packed up by a tape and then wound on a reel and supplied.

Consequentially, the chip is automatically mounted on the phase control layer 35 as an SMD (Surface Mount Device).

In this manner, a predetermined circuit portion of the phase shift unit 16, which includes the switching elements, is formed on the single chip and mounted on the phase control layer 35, thereby mounting the switching element with the relatively simple arrangement.

In addition, defect inspection can be executed for a single chip before the chip is mounted on the phase control layer 35, thereby improving the yield of the entire apparatus.

In particular, since the bare chip is sealed and mounted in a package, convenient, automatic mounting can be realized at a high-speed, thereby reducing the number of assembling processes.

A circuit included in the chip will be described next with reference to FIG. 11.

The phase shift units 16 (i.e., the phase shifters 17, the parts of the strip lines connected to the phase shifters 17, and the phase controllers 18) corresponding to the radiating elements 15 have circuit portions which are repeatedly used.

For example, referring to FIG. 5, the driver circuits 19A to 19D have the same arrangement.

The phase shift circuit 17A has a common circuit arrangement used in the phase shifters 17 corresponding to the radiating elements 15. The remaining phase shift circuits 17B to 17D are similar to the phase shift circuit 17A.

Accordingly, of the circuit portions, an identical portion used for each radiating element 15 or each of the phase shift circuits 17A to 17D is formed on a single chip. Therefore, the chip can be shared by the circuit portions.

Figure 11A:
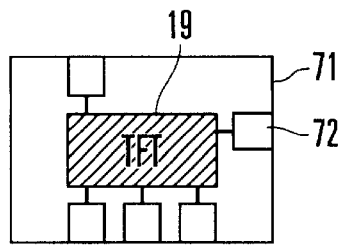
FIG. 11 shows views for explaining examples of circuits included on a chip.

For example, referring to FIG. 11(a), each of the driver circuits 19A to 19D is formed on a single chip as a unit.

In this case, two latches 191 and 192 included in the driver circuit 19 are formed from thin-film transistors (TFTs) on a glass substrate 71 and surrounded by pads 72 for signal connection.

With this structure, the chip can be shared by all the driver circuits 19A to 19D corresponding to the phase shift circuits 17A to 17D.

Figure 11B:
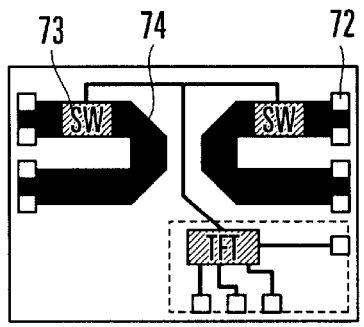

Referring to FIG. 11(b), the driver circuits 19A to 19D and the switches 17S are paired on a single chip as a unit.

A portion surrounded by a broken line corresponds to FIG. 11(a), and, together with this portion, two switching elements 73 of the switches 17S, strip lines 74 for supplying signals to the switching elements 73, and the pads 72 are formed on the single chip. Thus, the chips can be shared by all the phase shift circuits 17A to 17D.

Figure 11C:
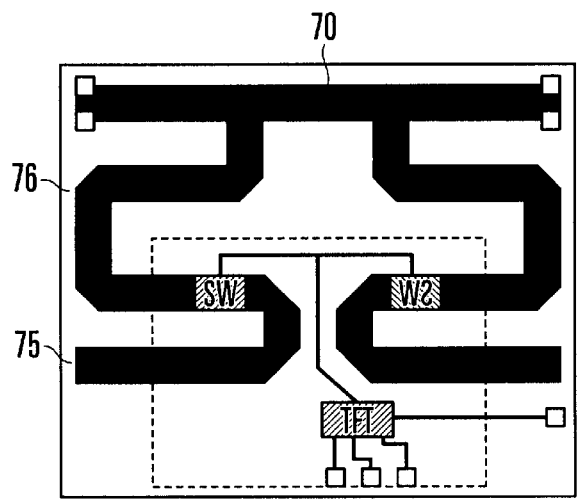

Referring to FIG. 11(c), one of the driver circuits 19A to 19D and a corresponding one of the phase shift circuits 17A to 17D are paired on a single chip as a unit.

A portion surrounded by a broken line corresponds to FIG. 11(b), and, together with this portion, strip lines 75 for connecting the switches 17S to the strip line 16A, distributed constant lines 76 connected to the switches on the sides opposite to the strip lines 75 and each having a length corresponding to a phase shift amount of one of the phase shift circuits 17A to 17D, and a main line 70 are formed on the single chip.

Thus, the chips can be shared by the phase shift circuits 17A to 17D of each phase shift unit 16.

Figure 11D:
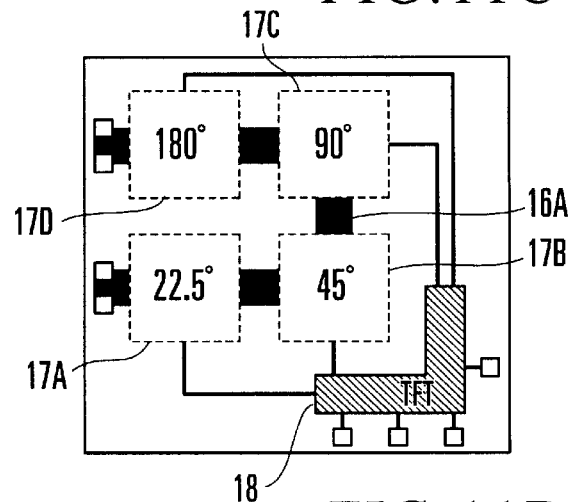

Referring to FIG. 11(d), all the driver circuits 19A to 19D and the phase shift circuits 17A to 17D in each phase shift unit 16 are formed on a single chip as a unit.

Portions each surrounded by a broken line correspond to FIG. 11(c), and, together with these portions, the strip lines 16A for connecting the phase shift circuits 17A to 17D to each other are formed on the single chip.

In this case, all the driver circuits 19A to 19D are integrated and formed from thin-film transistors (TFTs) on the glass substrate 71 as the phase controller 18.

Thus, the chips can be shared by each phase shift unit 16.

Figure 11E:
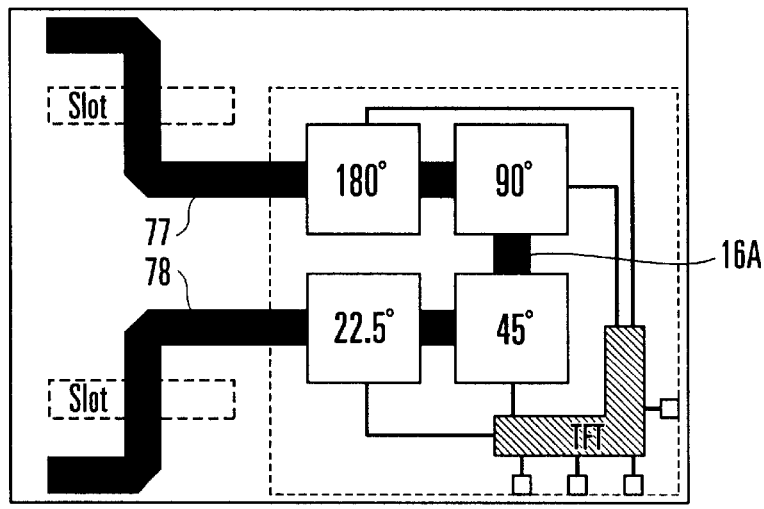

Referring to FIG. 11(e), each phase shift unit 16 is formed on a single chip as a unit.

A portion surrounded by a broken line correspond to FIG. 11(d), and, together with the portion, a strip line 77 for connecting the slot 22 to the strip line 16A and a strip line 78 for connecting the strip line 16A to the slot 21 are formed on the single chip.

Thus, each chip can be shared by each phase shift unit 16.

In this manner, a predetermined circuit portion of the phase shift unit 16, which includes the switching elements, is formed in the single chip and mounted on the phase control layer 35, thereby mounting the switching element with the relatively simple arrangement.

This can reduce the number of assembling processes as well as the number of components and the number of connections.

In FIG. 11, the routed line type phase shift circuit for controlling a feed phase by branching and connecting the predetermined distributed constant line through the switches 17S has been explained. However, the present invention is not limited to this, and a phase shift circuit having any other type such as a line switch type or reflection type may be used.

Generally, if the phase shift amount is relatively small, characteristics obtained by the routed line type phase shift circuit are better than those in any other phase shift circuit, and if the phase shift amount is relatively large, characteristics obtained by a line switch type phase shift circuit are better than those in any other phase shift circuit.

For example, in examples to be described later, the phase shift circuits 17A to 17C having phase shift amounts of 22.5°, 45°, and 90°, respectively, are constructed by the routed line type, and the phase shift circuit 17D having a phase shift amount of 180° is formed by the line switch type.

A case wherein thin-film transistors are formed on the glass substrate as the driver circuits 19A to 19D has been described with reference to FIGS. 9 to 11, however, the other invention is effective even if transistors diffused on the semiconductor substrate are used in place of the thin-film transistors.

As for the switch 17S, the case wherein the micromachine switches are formed on the glass substrate has been described. However, the other invention is effective even if a transistor circuit or diode on the semiconductor substrate is used in place of the micromachine switch.

EXAMPLES

Examples 1 to 6 (examples of arrangements for each radiating element) will be described below with reference to FIGS. 12 to 18, in which the present invention is applied to a 30-GHz phased array antenna.

A case wherein a phase shifter 17 is made up of four phase shift circuits 17A to 17D having different phase shift amounts of 22.5°, 45°, 90°, and 180° will be described below.

Assuming that a micromachine switch is used as the switching element of the phase shift circuit.

The sizes to be described below are merely examples for 30 GHz, and change depending on the change in frequency. However, other sizes can be used for 30 GHz.

Example 1 will be described first with reference to FIG. 12.

Figure 12A:
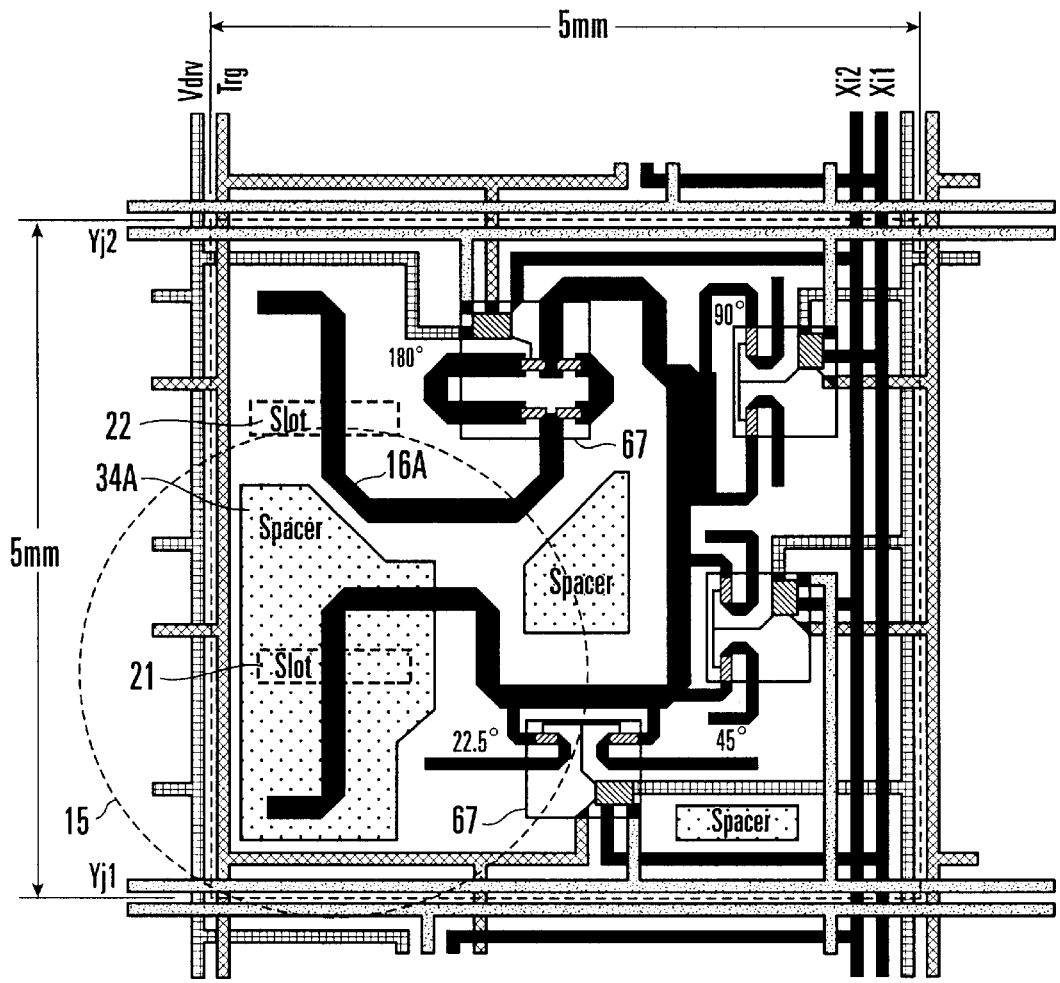
FIG. 12 shows views of a circuit arrangement according to Example 1.
Figure 12B:
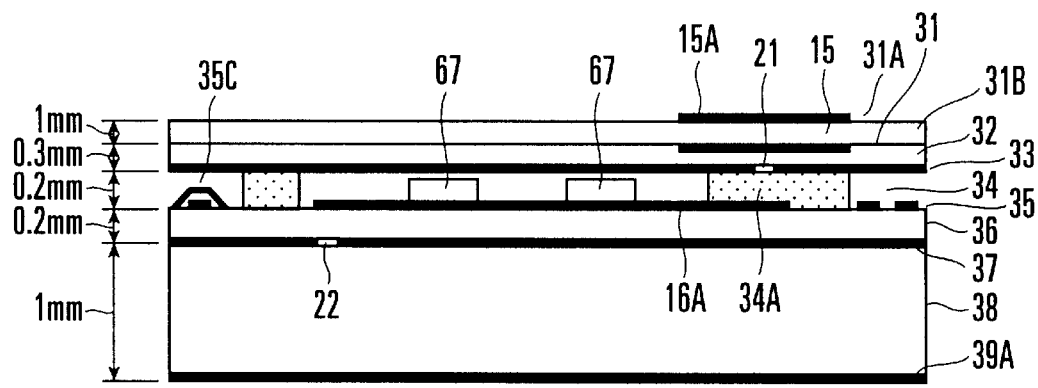

FIG. 12 shows views of a circuit arrangement of Example 1, in which FIG. 12(a) is a circuit diagram showing the arrangement of a phase control layer in the whole phase shift unit, and FIG. 12(b) is a schematic view showing a multilayered structure.

The circuit portion shown in FIG. 11(b), i.e., the case wherein a driver circuit and switches are formed into a single chip will be described below.

As shown in FIG. 12(a), a phase shift unit 16 is arranged in correspondence with each of radiating elements 15 arranged in an array and formed within a substantially square (5 mm×5 mm) region (see a broken-line square shown in FIG. 12(a)).

In particular, surrounding the phase shift unit 16, signal lines Xi1 and Xi2 extending from a signal line driver 12X, scanning lines Yj1 and Yj2 extending from a scanning line selector 12Y, a trigger signal line Trg extending from a control unit 11, and a switch driving power line Vdrv are arranged in a matrix.

In an internal region defined by the wiring lines, a strip line 16A for connecting an upper portion via a slot 22 to a lower portion via a slot 21 is arranged.

Phase shift circuits for 22.5°, 45°, 90°, and 180° and driver circuits corresponding to the respective phase shift circuits are arranged midway along the microstrip line 16A.

A part of the phase shift circuits 17A to 17D and a part of the driver circuits 19A to 19D, i.e., the switches 17S and driver circuits 19A to 19D in this case are formed into a shingle chip 67.

The radiating element 15 (broken narrow line shown in FIG. 12(a)) having a diameter of 2.5 mm to 4 mm is arranged on a radiating element layer 31 above the slot 21.

Figure 13A:
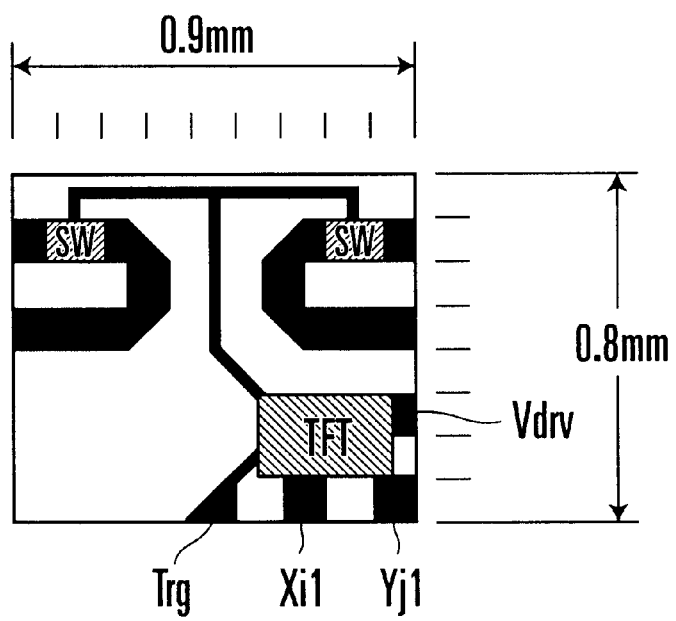
FIG. 13 shows views of circuit arrangements on a chip.
Figure 13B:
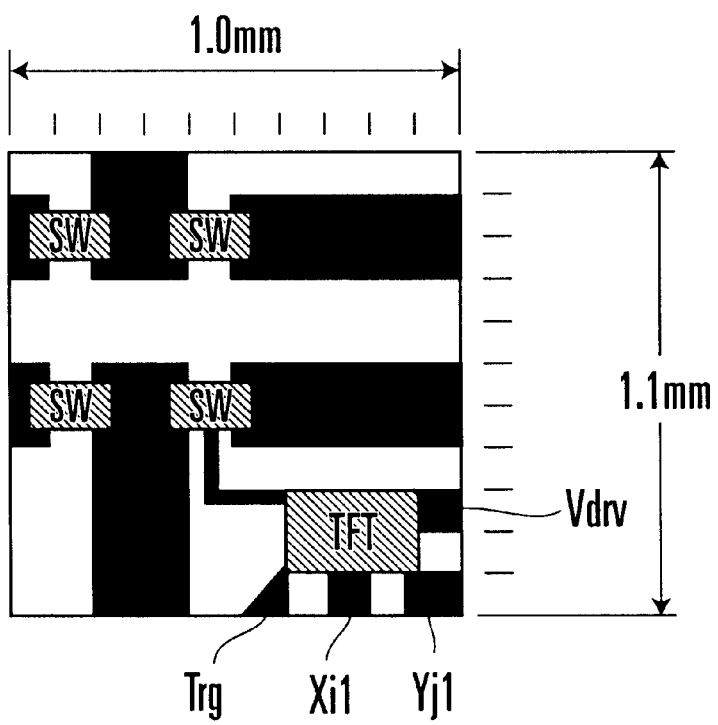

FIG. 13 shows circuit arrangement views of chips shown in Examples 1 and 2, respectively, in which FIG. 13(a) shows a chip used in the phase shift circuits for 22.5°, 45°, and 90°, and FIG. 13(b) shows a chip used in the phase shift circuit for 180°.

The chip shown in FIG. 13(a) can also be used for a routed line type phase shift circuit, and the chip shown in FIG. 13(b) can also be used for a line switch type phase shift circuit.

The arrangement of the chip in FIG. 13 is the same as that shown in FIG. 9(b) and FIGS. 10(a) to 10(d) mentioned previously, and a description thereof will be omitted.

FIG. 12(b) shows the multilayered structure in Example 1, and the same reference numerals as in FIG. 2 denote the same parts.

Note that FIG. 12(b) schematically shows the multilayered structure, but does not show a specific section in FIG. 12(a).

The multilayered structure of this example is obtained by sequentially stacking from the bottom to top in FIG. 12(b), a ground layer 39A, a dielectric layer 38 (1 mm thick) in which a radial waveguide is formed, a ground layer 37, a dielectric layer 36 (0.2 mm thick), the phase control layer 35, a dielectric layer 34 (0.2 mm thick), a ground layer 33 in which the coupling slot 21 is formed, a dielectric layer 32 (0.3 mm thick), the radiating element layer 31, a dielectric layer 31B (1 mm thick), and a passive element layer 31A.

In this structure, the dielectric layer 34 between the phase control layer 35 and ground layer 33 has a space ensured by 0.2-mm thick (high) spacers 34A, and the chips 67 are mounted on the phase control layer 35.

In this case, the spacer 34A may be arranged below the slot 21. With this arrangement, a space under the slot 21, which generally an unused region, also serves as a region in which the spacer 34A is arranged, thereby reducing the area occupied by the spacer 34A.

As the spacer 34A, if a material having high relative dielectric constant of about 5 to 30 such as alumina is used, the slots 21 and the strip lines 16A on the phase control layer 35 are efficiently coupled in a high-frequency manner.

On the phase control layer 35, a zero-ohm jumper resistor can be used to prevent interference at the intersection, where the scanning lines Yj1 and Yj2 wired in the horizontal direction intersect the signal lines Xi1 and Xi2, the trigger signal line Trg, and the switch driving power line Vdrv wired in the vertical direction.

As for the intersection, likewise the example to be described later, the intersecting wiring lines wired in one direction are formed on a layer different from the phase control layer 35, or formed on the intermediate layer of the two-layered phase control layer 35, thereby preventing interference.

Example 2 of the present invention will be described with reference to FIG. 14.

Figure 14A:
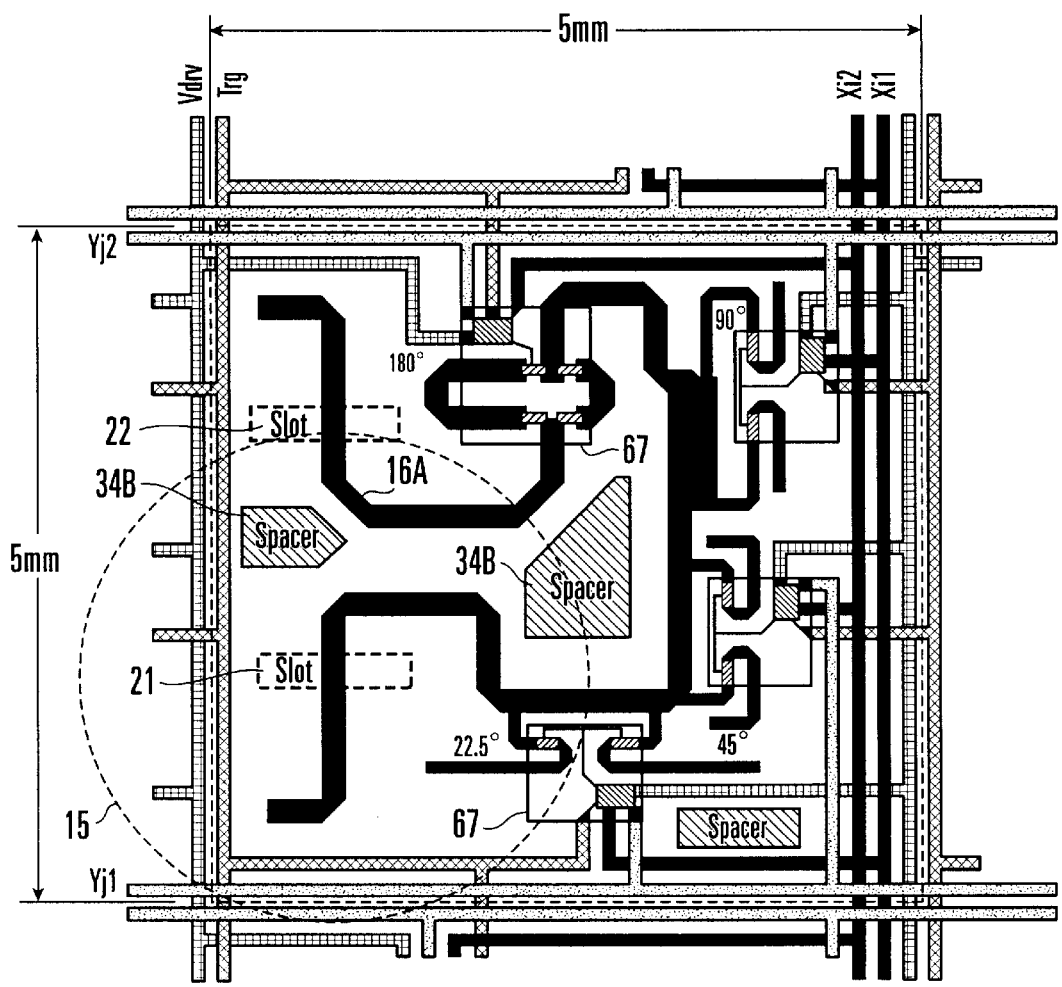
FIG. 14 shows views of a circuit arrangement according to Example 2.
Figure 14B:
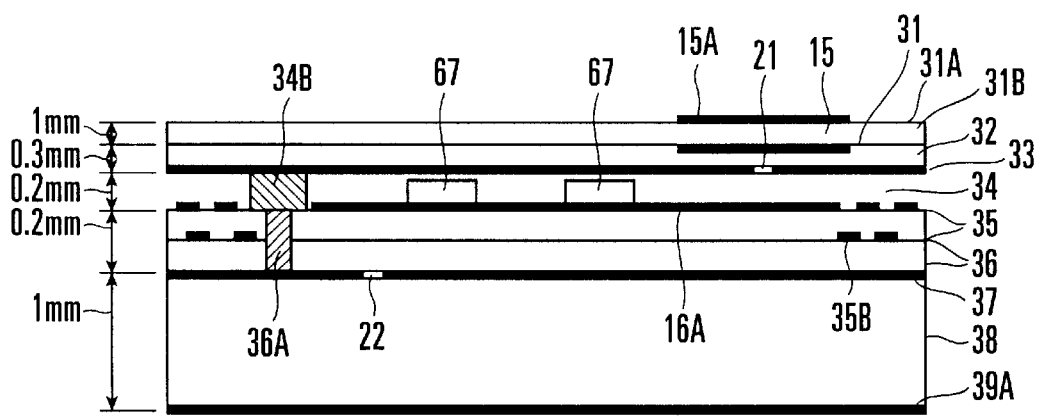

FIG. 14 shows views of a circuit arrangement of Example 2, in which FIG. 14(a) is a circuit diagram showing the arrangement of a phase control layer in the whole phase shift unit, and FIG. 14(b) is a schematic view showing a multilayered structure.

As in Example 1, the circuit portion shown in FIG. 11(b), i.e., the case wherein a driver circuit and switches are formed into a single chip will be described below.

In this example, a chip 67 is mounted on a phase control layer 35 having a two-layered structure. A dielectric layer 34 between the phase control layer 35 and a coupling layer 33 is comprised of a space which is ensured by a spacer 34B made of a 0.2-mm thick (high) conductor.

The spacer 34B may be formed above a via hole 36A and electrically connected to a ground pattern, e.g., a conductive pattern of a coupling layer 37.

With this structure, an inter-ground-plate unnecessary mode (a parallel-plate mode) can be suppressed without individually forming any means which couples ground potentials with each other.

Since the phase control layer 35 has two layers, wiring lines wired in one direction are wired as intermediate layer wiring lines 35B so that scanning lines Yj1 and Yj2 wired in the horizontal direction, and signal lines Xi1 and Xi2, a trigger signal line Trg, and a switch driving power line Vdrv wired in the vertical direction can be wired without interfering at the intersection therebetween.

Example 3 of the present invention will be described with reference to FIG. 15.

Figure 15A:
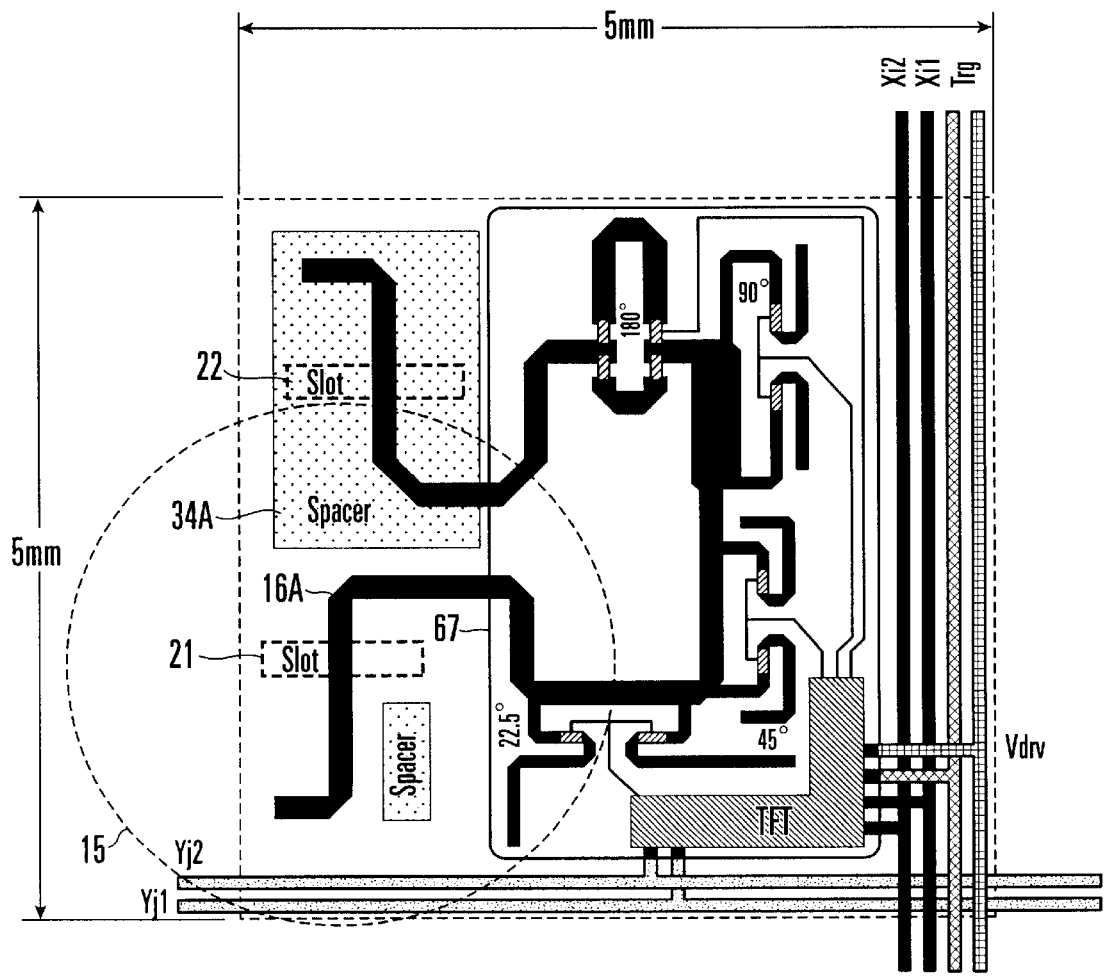
FIG. 15 shows views of a circuit arrangement according to Example 3.
Figure 15B:
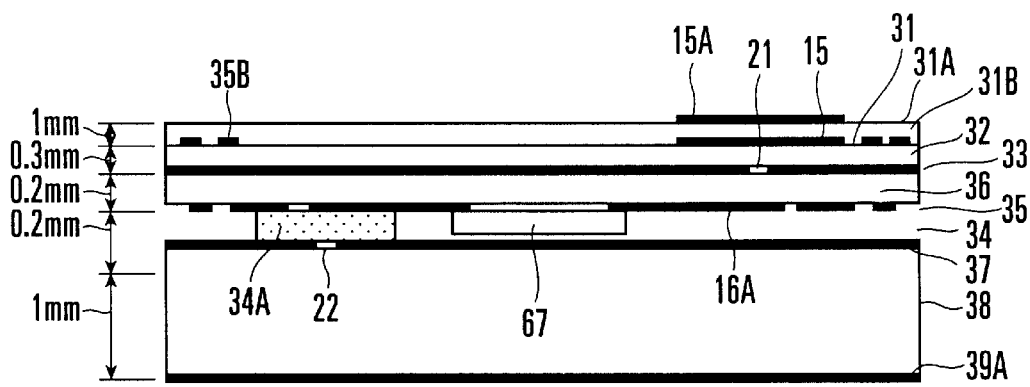

FIG. 15 shows views of a circuit arrangement of Example 3, in which FIG. 15(a) is a circuit diagram showing the arrangement of a phase control layer in the whole phase shift unit, and FIG. 15(b) is a schematic view showing a multi-layered structure.

The circuit portion shown in FIG. 11(d), i.e., the case wherein all phase shift circuits and all driver circuits in a phase shift unit are formed into a single chip will be described below.

In this case, a phase control layer 35 has a single layer as in Example 1 shown in FIG. 12, however, the stacking order of a dielectric layer 34, the phase control layer 35, and a dielectric layer 36 is reversed.

Thus, the dielectric layer 34 comprised of a space is formed between a coupling layer 37 and the phase control layer 35, and the thickness (height) of the dielectric layer 34 is ensured by a spacer 34A. The dielectric layer 36 and a coupling layer 33 are tightly bonded.

Accordingly, a chip 67 is mounted on the phase control layer 35 facing down the dielectric layer 34.

In this case, the spacer 34A may be arranged above a slot 22. With this arrangement, a space immediately above the slot 22, which generally an unused region, also serves as a region in which the spacer 34A is arranged, thereby reducing the area occupied by the spacer 34A.

As the spacer 34A, if a material having high relative dielectric constant of about 5 to 30 such as alumina is used, the slots 22 and the strip lines 16A on the phase control layer 35 are efficiently coupled in a high-frequency manner.

In this example, wiring lines wired in one direction are wired as wiring lines 35B on a dielectric layer 32 so that, as in other examples, scanning lines Yj1 and Yj2 wired in the horizontal direction, and signal lines Xi1 and Xi2, a trigger signal line Trg, and a switch driving power line Vdrv wired in the vertical direction can be wired without interfering at the intersection therebetween.

Example 4 of the present invention will be described with reference to FIG. 16.

Figure 16A:
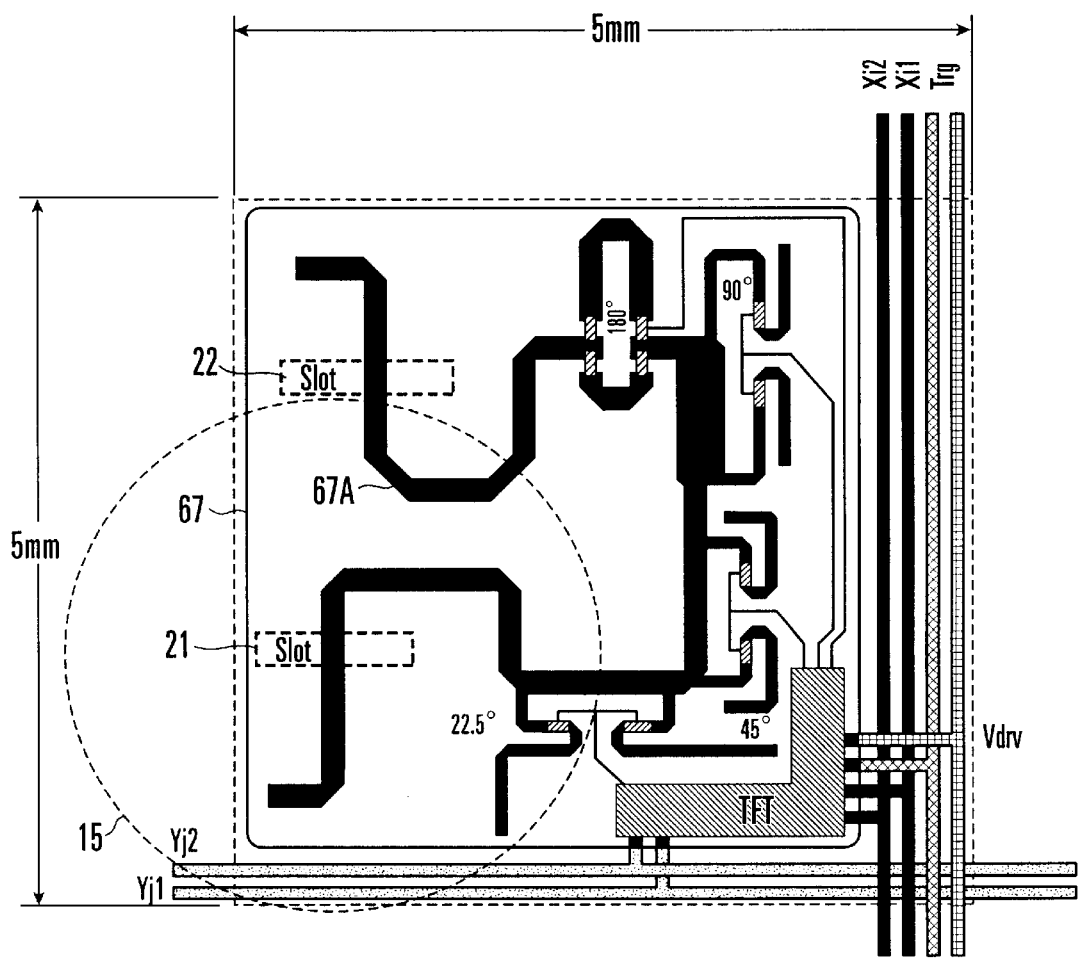
FIG. 16 shows views of a circuit arrangement according to Example 4.
Figure 16B:
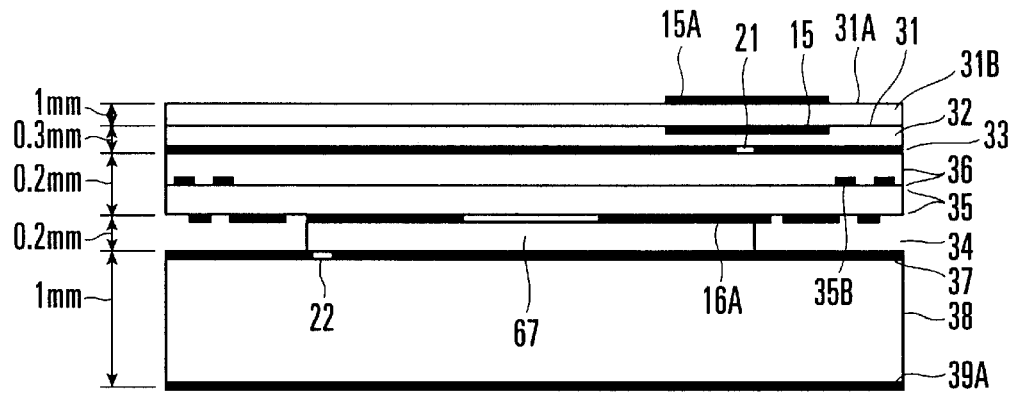

FIG. 16 shows views of a circuit arrangement of Example 4, in which FIG. 16(a) is a circuit diagram showing the arrangement of a phase control layer in the whole phase shift unit, and FIG. 16(b) is a schematic view showing a multi-layered structure.

The circuit portion shown in FIG. 11(e), i.e., the case wherein a whole phase shift unit is formed into a single chip will be described below.

Similar to Example 3, the stacking order of a phase control layer 35 and a dielectric layer 36 is reversed.

The lower surface of a chip 67 mounted with the phase control layer 35 facing down toward a space, i.e., a dielectric layer 34 is tightly bonded to a coupling layer 37, and the thickness (height) of the dielectric layer 34 is ensured by making the chip 67 0.2-mm thick.

Consequently, no region in which a spacer is arranged is required, thereby mounting the chip having a relatively large area.

Example 5 of the present invention will be described with reference to FIG. 17.

Figure 17A:
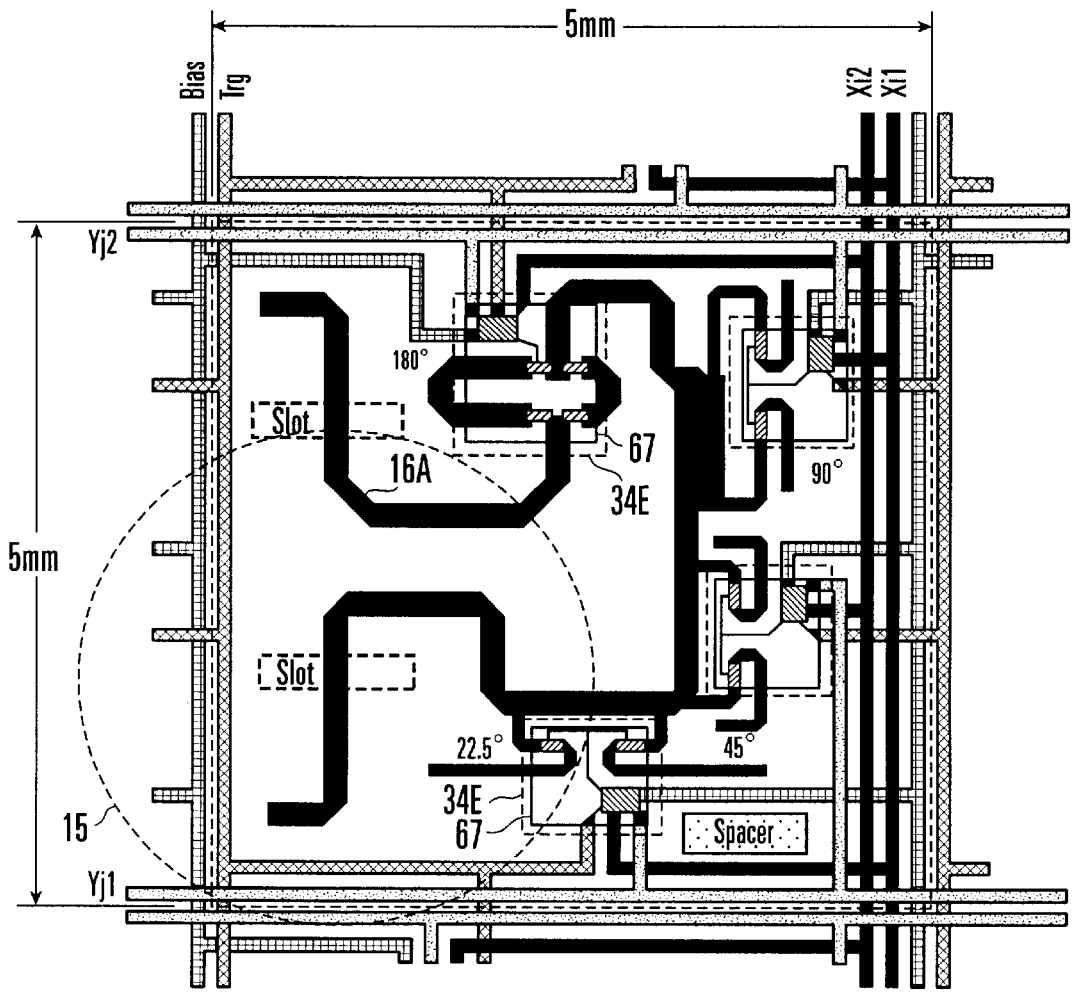
FIG. 17 shows views of a circuit arrangement according to Example 5.
Figure 17B:
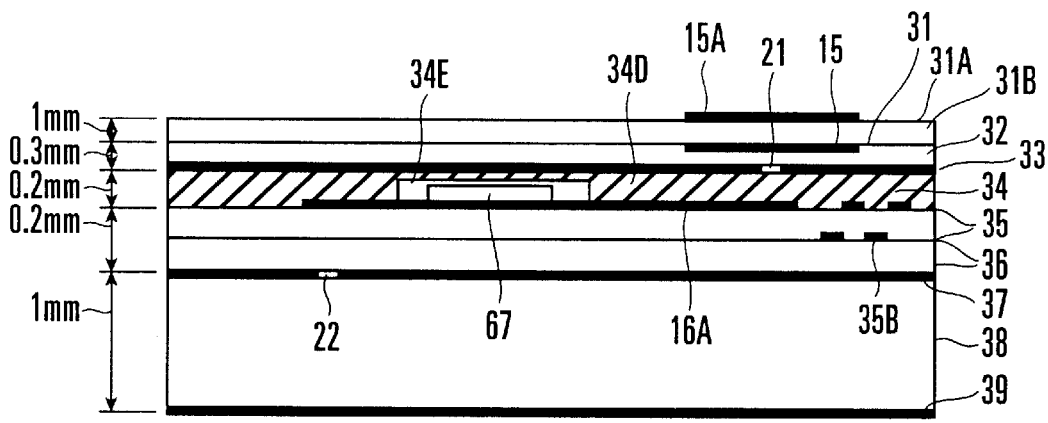

FIG. 17 shows views of a circuit arrangement of Example 5, in which FIG. 17(a) is a circuit diagram showing the arrangement of a phase control layer in the whole phase shift unit, and FIG. 17(b) is a schematic view showing a multi-layered structure.

As in Example 1, the circuit portion shown in FIG. 11(b), i.e., the case wherein a driver circuit and switches are formed into a single chip will be described below.

In this example, a chip 67 is mounted on a phase control layer having a two-layered structure, and a dielectric layer 34 comprised of a dielectric substrate 34D is arranged between the phase control layer 35 and a coupling layer 33.

A 0.2-mm thick cavity (space) 34E is formed at the position, in the substrate 34D, where the chip 67 is mounted on the phase control layer 35, and the chip 67 is housed in the cavity 34E when the substrates are tightly bonded.

As a method of forming the cavity 34E in the substrate 34D, machining in which the surface of the substrate 34D is cut using a router or in which a through hole is formed by punching may be used. Alternatively, after a photosensitive resin is applied on an organic substrate, the resin corresponding to the cavity 34E may be removed by exposing and developing processes. Various types of the formation methods are usable.

Example 6 of the present invention will be described with reference to FIG. 18.

Figure 18A:
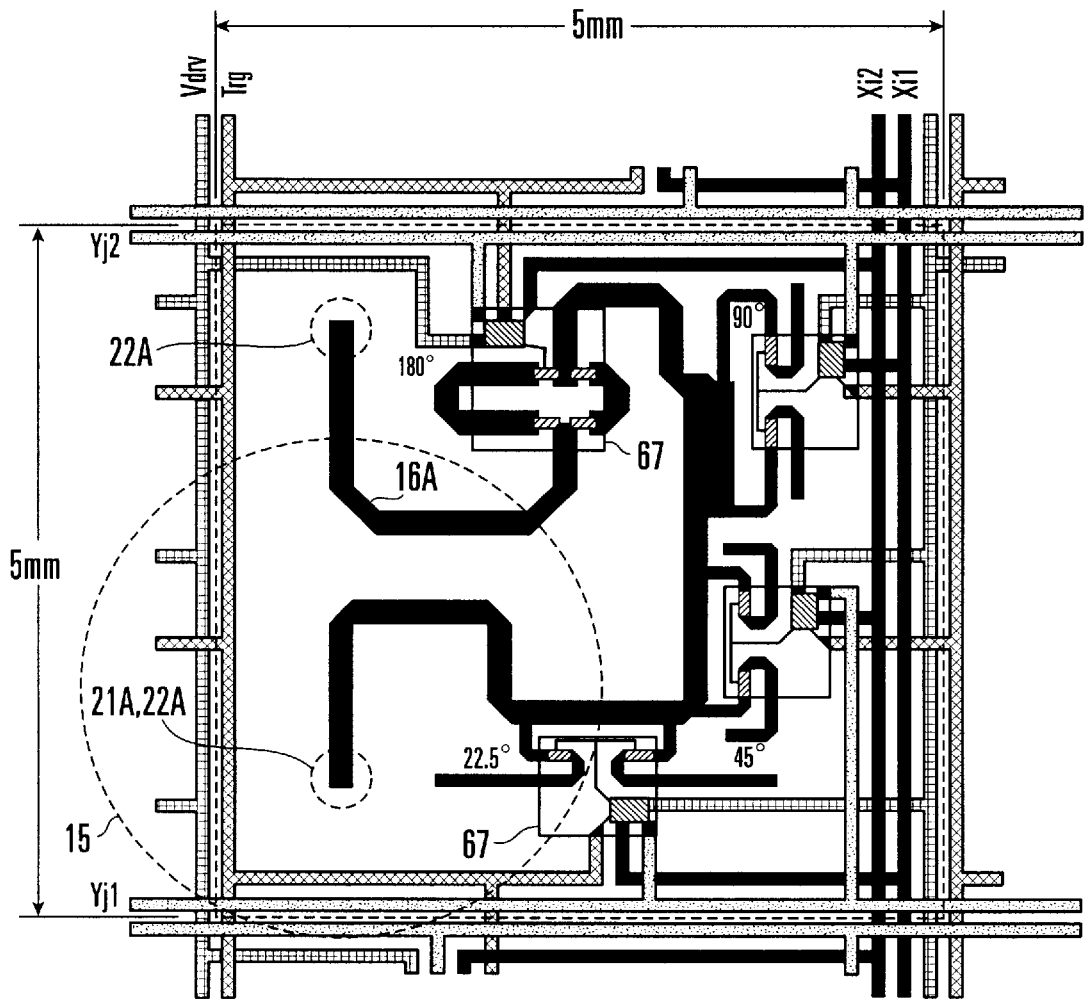
FIG. 18 shows views of a circuit arrangement according to Example 6.
Figure 18B:
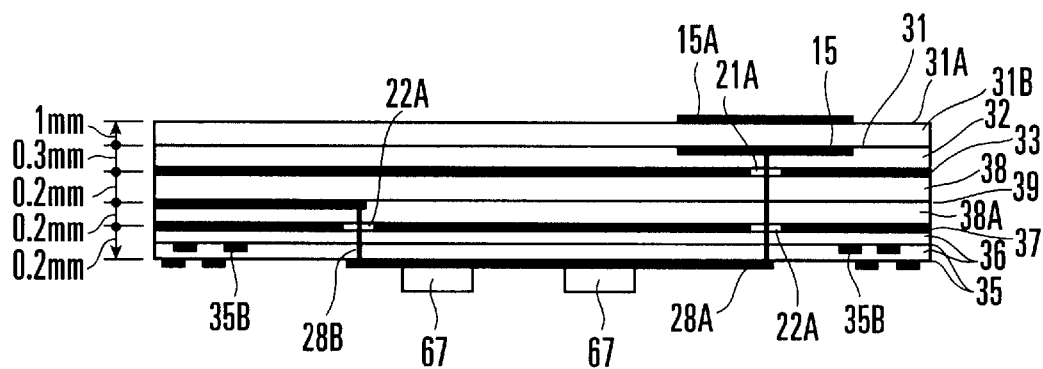
Figure 19:
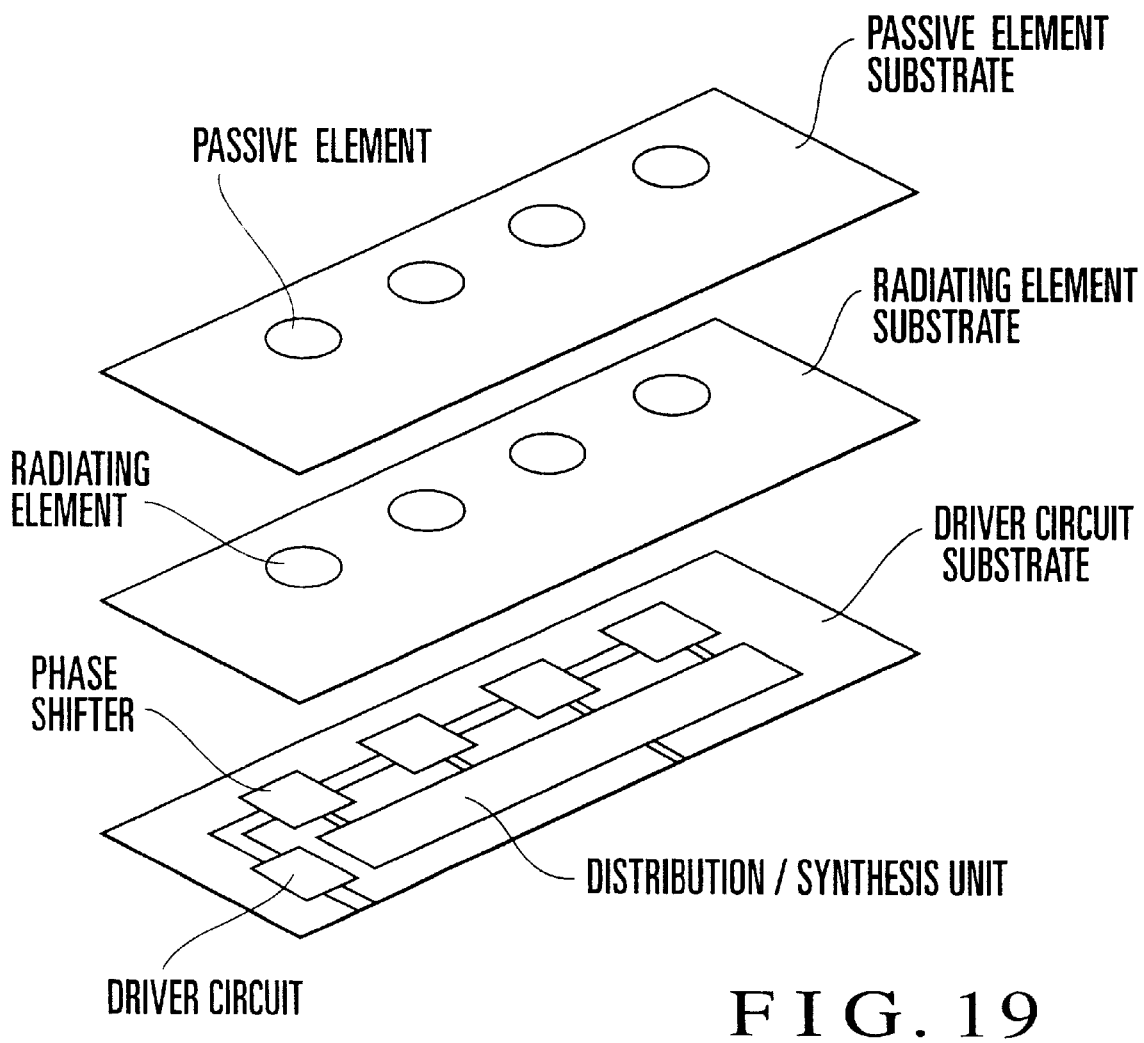
FIG. 19 is a view for explaining a conventional phased array antenna.

FIG. 18 shows views of a circuit arrangement of Example 6, in which FIG. 18(a) is a circuit diagram showing the arrangement of a phase control layer in the whole phase shift unit, and FIG. 18(b) is a schematic view showing a multi-layered structure.

As in Example 1, the circuit portion shown in FIG. 11(b), i.e., the case wherein a driver circuit and switches are formed into a single chip will be described below.

In this example, a stacking order is different from that in Examples 1 to 5. The layers are stacked from the bottom to top in an order of a phase control layer 35, dielectric layer 36, coupling layer 37, dielectric layer 38A, distribution/synthesis layer 39, dielectric layer 38, coupling layer 33, dielectric layer 32, radiating element layer 31, dielectric layer 31B, and passive element layer 31A.

The phase control layer 35 has a two-layered structure, and wiring lines 35B are formed in the intermediate layer of the phase control layer 35.

In this case, a feed pin 28B extending through a hole 22A formed in the dielectric layer 37 may connect the distribution/synthesis layer 39 to the phase control layer 35 in a high-frequency manner, and a feed pin 28A extending through a hole 22A formed in the dielectric layer 37 and a hole 21A formed in the coupling layer 33 may also connect the phase control layer 35 to a radiating element 15 in a high-frequency manner.

As in this example, the phase control layer 35 is arranged as the outermost layer so that the stacked structure can be obtained regardless of the height of a chip 67.

Industrial Applicability

The phased array antenna of the present invention is a high-gain antenna applicable to an RF band, and is effective for a satellite tracking on-vehicle antenna or satellite borne antenna used for satellite communication.

What is claimed is:

1. A phased array antenna having a multilayered structure, comprising:

plural radiation elements on one layer of the multilayered structure;

plural phase controllers on a further layer of the multi-layered structure for controlling phases of RF signals transmitted from said plural radiation elements by application of respective phase shift amounts, each of said plural phase controllers comprising connective wiring on said further layer and a phase control circuit that sets the respective phase shift amount and that is carried by a substrate mounted on said further layer, said connective wiring being operatively connected to said phase control circuit;

plural signal lines for providing respective phase shift amount signals to said plural phase controllers; and plural scanning lines for providing respective timing signals that set a of time of application of the respective phase shift amounts by said plural phase controllers, said plural scanning lines and said plural signal lines being arranged transversely to each other in a matrix on said further layer, said plural phase controllers being connected to respective ones of said plural scanning lines and said plural signal lines adjacent to intersections thereof.

2. The antenna of claim 1, wherein said phase control circuit comprises plural driver circuits that each set a different phase shift amount and is carried by a respective separate substrate mounted on said further layer.

3. The antenna of claim 2, wherein each of said driver circuits comprises a latch responsive to respective ones of the phase shift amount signals and timing signals.

4. The antenna of claim 1, further comprising a trigger signal line for selectively providing trigger signals that delay application of the respective phase shift amounts by said plural phase controllers.

5. The antenna of claim 4, wherein said phase control circuit comprises plural driver circuits that each set a different phase shift amount and is carried by a respective separate substrate mounted on said further layer, and wherein each of said driver circuits comprises a latch responsive to respective ones of the trigger signals.

* * * * *